US012757651B2

(12) United States Patent
Coleman et al.

(10) Patent No.: US 12,757,651 B2
(45) Date of Patent: Oct. 6, 2026

(54) ELECTROLESS DEPOSITION PROCESS FOR SEMICONDUCTOR DEVICES

(71) Applicant: Wolfspeed, Inc., Durham, NC (US)

(72) Inventors: Meagan Lenore Coleman, Utica, NY (US); Upendra Milind Phatak, New Hartford, NY (US); Chris Cook, Cary, NC (US); Robert Justin Morgan, Clifton Park, NY (US); John Adam Wangelin, Angier, NC (US); Bee Bee Teo, Holly Springs, NC (US); Allison Lee Norris, Utica, NY (US)

( * ) Notice: Subject to any disclaimer, the term of this patent is extended or adjusted under 35 U.S.C. 154(b) by 352 days.

(21) Appl. No.: 18/410,443

(22) Filed: Jan. 11, 2024

(65) Prior Publication Data

US 2025/0201565 A1 Jun. 19, 2025

Related U.S. Application Data

(63) Continuation-in-part of application No. 18/545,648, filed on Dec. 19, 2023.

(51) Int. Cl.
*H10P 14/46* (2026.01)
*C23C 18/16* (2006.01)
*C25D 3/02* (2006.01)

(52) U.S. Cl.
CPC .......... *H10P 14/46* (2026.01); *C23C 18/1651* (2013.01); *C25D 3/02* (2013.01)

(58) Field of Classification Search
CPC ............................. H10P 14/46; C23C 18/1651
See application file for complete search history.

(56) References Cited

U.S. PATENT DOCUMENTS

2004/0097071 A1* 5/2004 Ivanov ................ C23C 18/1651 257/E21.174
2008/0179193 A1* 7/2008 Duh ....................... C25D 21/12 205/261
2011/0051387 A1 3/2011 Tachibana et al.

FOREIGN PATENT DOCUMENTS

JP 2022054004 4/2022

OTHER PUBLICATIONS

International Search Report and Written Opinion for Application No. PCT/US2024/060754, mailed Jun. 3, 2025, 29 pages.

(Continued)

*Primary Examiner* — Steven M Page
(74) *Attorney, Agent, or Firm* — Dority & Manning, P.A.

(57) ABSTRACT

Electroless deposition processes for semiconductor device fabrication are provided. In one example, a method for electroless deposition of a metal layer on a wide bandgap semiconductor device includes providing a semiconductor wafer having one or more wide bandgap semiconductor devices. The method includes performing an activation layer deposition process on at least a portion of the semiconductor wafer to deposit an activation layer. At least a portion of the activation layer deposition process comprises an activation layer etchant process. The method includes depositing one or more metal layers on the activation layer using an electroless deposition process. Conducting the activation layer etchant process includes providing the semiconductor wafer in an etchant bath for a first process period; removing the semiconductor wafer from the etchant bath; and after removing the semiconductor wafer from the etchant bath, providing the semiconductor wafer in the etchant bath for a second process period.

18 Claims, 10 Drawing Sheets

(56) References Cited

OTHER PUBLICATIONS

Lin et al., "The Morphologies and the Chemical States of the Multiple Zincating Deposits on AI Pads of Si Chips", Elsevier, Thin Solid Films, vol. 288, 1996, pp. 36-40.

* cited by examiner

ELECTROLESS DEPOSITION PROCESS FOR SEMICONDUCTOR DEVICES

PRIORITY CLAIM

The present application is a continuation in part of U.S. application Ser. No. 18/545,648 having a filing date of Dec. 19, 2023. Applicant claims priority to and the benefit of each of such applications and incorporates all such applications herein by reference in its entirety.

FIELD

The present disclosure relates generally to semiconductor devices.

BACKGROUND

Power semiconductor devices are used to carry large currents and support high voltages. A wide variety of power semiconductor devices are known in the art including, for example, transistors, diodes, thyristors, power modules, discrete power semiconductor packages, and other devices. For instance, example semiconductor devices may be transistor devices such as Metal Oxide Semiconductor Field Effect Transistors ("MOSFET"), bipolar junction transistors ("BJTs"), Insulated Gate Bipolar Transistors ("IGBT"), Gate Turn-Off Transistors ("GTO"), junction field effect transistors ("JFET"), high electron mobility transistors ("HEMT") and other devices. Example semiconductor devices may be diodes, such as Schottky diodes or other devices. Example semiconductor devices may be power modules, which may include one or more power devices and other circuit components and can be used, for instance, to dynamically switch large amounts of power through various components, such as motors, inverters, generators, and the like. These semiconductor devices may be fabricated from wide bandgap semiconductor materials, such as silicon carbide ("SiC") and/or Group III nitride-based semiconductor materials.

SUMMARY

Aspects and advantages of embodiments of the present disclosure will be set forth in part in the following description, or may be learned from the description, or may be learned through practice of the embodiments.

One example aspect of the present disclosure is directed to a method for electroless deposition of a metal layer on a wide bandgap semiconductor device. The method includes providing a semiconductor wafer having one or more wide bandgap semiconductor devices. The method includes performing an activation layer deposition process on at least a portion of the semiconductor wafer to deposit an activation layer. At least a portion of the activation layer deposition process comprises an activation layer etchant process. The method includes depositing one or more metal layers on the activation layer using an electroless deposition process. Conducting the activation layer etchant process includes providing the semiconductor wafer in an etchant bath for a first process period; removing the semiconductor wafer from the etchant bath; and after removing the semiconductor wafer from the etchant bath, providing the semiconductor wafer in the etchant bath for a second process period.

Another example aspect of the present disclosure is directed to a method of reducing nodule formation on one or more semiconductor devices on a semiconductor wafer. The method includes performing a multi-dip activation layer deposition process to form an activation layer for one or more contacts for semiconductor devices on the semiconductor wafer. The method includes electroless depositing one or more metal layers on the activation layer. The multi-dip activation layer deposition process provides a nodule rejection yield for the semiconductor wafer of at least about 65%.

Another example aspect of the present disclosure is directed to a method for electroless deposition of a metal layer on a semiconductor device on a semiconductor wafer. The method includes depositing a first activation layer on the semiconductor wafer. The method includes providing the semiconductor wafer in an etchant bath for a first process period. The method includes performing a rinse process on the semiconductor wafer. The method includes providing the semiconductor wafer in the etchant bath for a second process period. The method includes depositing a second activation layer on the semiconductor wafer.

Another example aspect of the present disclosure is directed to a system for electroless deposition. The system includes an activation layer deposition bath. The system includes an activation layer etchant bath. The system includes a rinse system. The system includes a semiconductor wafer carrier operable to carry one or more semiconductor wafers. The system includes one or more control devices. The one or more control devices are configured to control the semiconductor wafer carrier to perform operations. The operations include providing the semiconductor wafer carrier into the activation layer deposition bath; providing the semiconductor wafer carrier into the activation layer etchant bath for a first process period; providing the semiconductor wafer carrier to the rinse system; and providing the semiconductor wafer carrier into the activation layer etchant bath for a second process period.

Another example aspect of the present disclosure is directed to a semiconductor wafer. The semiconductor wafer includes at least one semiconductor device. The at least one semiconductor device has an electroless deposited metal layer. The electroless deposited metal layer includes at least one 50 micron nodule reduced region.

Another example aspect of the present disclosure is directed to a semiconductor wafer. The semiconductor wafer includes at least one semiconductor device. The at least one semiconductor device has an electroless deposited metal layer. The semiconductor wafer has a nodule rejection yield of at least about 65%.

Another example aspect of the present disclosure is directed to a method for electroless deposition of a contact pad on a semiconductor wafer. The method includes providing the semiconductor wafer in an activation layer etchant bath along a direction of immersion. The method includes electroless depositing a contact pad for a semiconductor device on the semiconductor wafer. The semiconductor wafer is oriented relative to the direction of immersion such that an average surface roughness along an edge region of the contact pad is in a range of about 20 nm to about 29 nm. The edge region is defined as a region within 25 nm from the perimeter of the contact pad.

Another example embodiment of the present disclosure is directed to a semiconductor wafer. The semiconductor wafer includes at least one semiconductor device. The at least one semiconductor device has an electroless deposited metal layer. The electroless deposited metal layer comprises an edge region having an average surface roughness in a range of about 20 nm to about 29 nm. The edge region is defined as a region within 25 nm from a perimeter of the metal layer.

Another example aspect of the present disclosure is directed to a method for electroless deposition of a contact pad on a semiconductor wafer. The method includes providing the semiconductor wafer in an activation layer etchant bath along a direction of immersion. The method includes electroless depositing a contact pad for a semiconductor device on the semiconductor wafer. The semiconductor wafer is oriented relative to the direction of immersion such that a notch in the semiconductor wafer is angled relative to the direction of immersion.

Another example embodiment of the present disclosure is directed to a method for electroless deposition of a contact pad on a semiconductor wafer. The method includes providing the semiconductor wafer in an activation layer etchant bath along a direction of immersion. The method includes electroless depositing a contact pad for a semiconductor device on the semiconductor wafer. The semiconductor wafer is oriented relative to the direction of immersion such that at least one contact pad on the semiconductor wafer has an edge that is generally parallel to the direction of immersion.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which.

DETAILED DESCRIPTION

Figure 1:
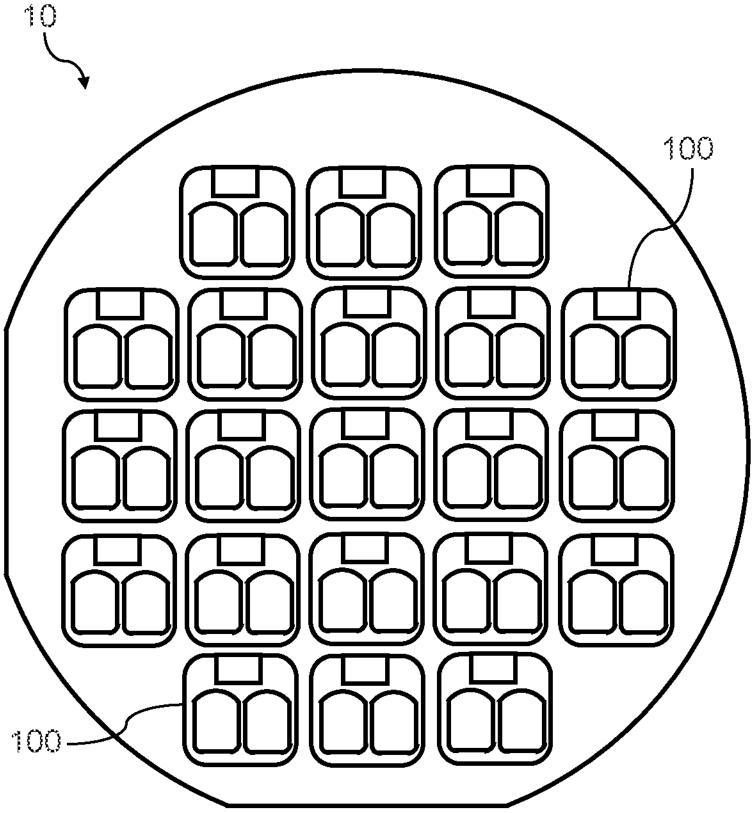
FIG. 1 depicts a plan view of a semiconductor wafer that includes a plurality of semiconductor devices according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

A power semiconductor device may have a semiconductor substrate, such as a silicon carbide substrate having a first conductivity type (e.g., an n-type substrate), on which an epitaxial layer structure having the first conductivity type (e.g., n-type) is formed. A portion of this epitaxial layer structure (which may include one or more separate layers) functions as a drift region of the power semiconductor device. The device typically includes an "active region," which includes one or more unit cell structures that have a junction such as a p-n junction. The active region may be formed on and/or in the drift region. The active region acts as a main junction for blocking voltage in the reverse bias direction and providing current flow in the forward bias direction. The power semiconductor devices may have a unit cell structure in which the active region of each power semiconductor device includes a plurality of individual unit cell structures that are electrically connected in parallel and that together function as a single power semiconductor device.

Power semiconductor devices are often fabricated from wide bandgap semiconductor materials, such as silicon carbide or Group III-nitride based semiconductor materials (e.g., gallium nitride). Herein, a wide bandgap semiconductor material refers to a semiconductor material having a bandgap greater than 1.40 eV. Aspects of the present disclosure are discussed with reference to silicon carbide-based semiconductor structures as wide bandgap semiconductor structures. Those of ordinary skill in the art, using the disclosures provided herein, will understand that the power semiconductor devices according to example embodiments of the present disclosure may be used with any semiconductor material, such as other wide bandgap semiconductor materials, without deviating from the scope of the present disclosure. Example wide bandgap semiconductor materials include silicon carbide (e.g., 2.996 eV band gap for alpha silicon carbide at room temperature) and the Group III-nitrides (e.g., 3.36 eV band gap for gallium nitride at room temperature).

Power semiconductor devices can have a lateral structure or a vertical structure. In a device having a lateral structure, the terminals of the device (e.g., the drain, gate and source terminals for a power MOSFET device) are on the same major surface (e.g., top surface or bottom surface) of a semiconductor structure. In contrast, in a power semiconductor device having a vertical structure, at least one terminal is provided on each major surface of the semiconductor structure. For instance, in a vertical MOSFET device, the source may be on the top surface of the semiconductor structure and the drain may be on the bottom surface of the semiconductor structure, or vice versa. Herein, the term "semiconductor structure" refers to a structure that includes one or more semiconductor layers, such as semiconductor substrates and/or semiconductor epitaxial layers.

One approach to form such devices involves forming a plurality of "unit cell" structures, where each unit cell structure includes a transistor. In high power applications, a large number of these unit cells (e.g., hundreds or thousands) are typically provided on a single semiconductor substrate, and a gate electrode is formed on a top side of the semiconductor substrate that acts as the gate electrode for all of the unit cells. The opposite (bottom) side of the semiconductor substrate acts as a common drain for all of the unit cells of the device. A plurality of source contacts are formed on source regions in the semiconductor layer structure. In some embodiments, the source regions may be exposed within openings in the gate electrode. These source contacts are also electrically connected to each other to serve as a common source. The resulting device has three terminals, namely a common source terminal, a common drain terminal, and a common gate electrode that act as the terminals for the hundreds or thousands of individual unit cell transistors. It will be appreciated that the above description is of an n-type MOSFET; the locations of the drain and source, as well as the conductivity types of the various layers/regions, would be reversed for a p-type MOSFET.

Aspects of the present disclosure are discussed with reference to power silicon carbide-based MOSFET devices for purposes of illustration and discussion. Those of ordinary skill in the art, using the disclosures provided herein, will understand that aspects of the present disclosure are applicable to other semiconductor devices and applications without deviating from the scope of the present disclosure, such as other wide bandgap semiconductor devices, such as silicon carbide-based Schottky diodes and/or Group III-nitride based HEMTs. Aspects of the present disclosure may also be implemented with other semiconductor devices, such as silicon-based semiconductor devices on a silicon semiconductor wafer or other wafer (e.g., sapphire).

Semiconductor devices are fabricated on semiconductor wafers (e.g., silicon carbide-based semiconductor wafers). As part of the fabrication process, metal layers may be deposited on portions of the semiconductor devices. The metal layers may be, for instance, contact pads (e.g., gate pads, source pads, drain pads) that may be used to connect the semiconductor device to other components in a semiconductor device package (e.g., via one or more wire bonds). Many suitable techniques may be used to deposit metal layers on semiconductor devices during a fabrication process.

One example method for deposition of metal layers is electroless deposition. In electroless deposition, an activation layer (e.g., a zinc activation layer) is first deposited on the semiconductor wafer by, for instance, providing the semiconductor wafer in a solution (e.g., a zincate solution bath). The activation layer provides a catalytic surface for the electroless deposition process. A metal layer may be deposited during the electroless deposition process by providing the semiconductor wafer in another solution (e.g., a metal plating solution, such as a nickel-plating solution). The catalytic surface facilitates the reduction of metal ions from the plating solution onto the semiconductor wafer to form the metal layer.

In some examples, an electroless deposition process may result in the formation of nodules on the deposited metal layers on the semiconductor devices. Nodules are localized areas of increased surface roughness on the metal layer. The presence of a significant number of nodules on a metal surface may lead to anomalies in the semiconductor devices on which the nodules are formed. The semiconductor devices may not be suitable for operation, resulting in reduced yield of semiconductor devices fabricated on a semiconductor wafer.

Example aspects of the present disclosure are directed to electroless deposition process(s) and system(s) that result in reduced nodule formation on metal layers of the semiconductor devices fabricated on a semiconductor wafer. More particularly, in some examples, an activation layer deposition process (e.g., used to form a catalytic surface, such as a zinc surface) may include a multi-dip activation layer deposition process. As used herein, a "multi-dip" process refers to a process where a semiconductor wafer is provided into a bath or is otherwise exposed (e.g., via a spray) to a solution, is subsequently removed from the bath or is removed from exposure to the solution, and is subsequently provided at least one additional time into the bath or is otherwise exposed to the solution.

For instance, in some examples, the activation layer deposition process may include providing the semiconductor wafer into an activation layer deposition bath (e.g., zincate solution) a plurality of times. The semiconductor wafer may be removed and other process operations may be performed between each of the plurality of times the semiconductor wafer is provided into the activation layer deposition bath.

In some examples, the activation layer deposition process may include providing the semiconductor wafer into an activation layer etchant bath (e.g., etchant bath, such as a nitric acid bath) a plurality of times. The semiconductor wafer may be removed and other process operations (e.g., a rinse operation) may be performed between each of the plurality of times the semiconductor wafer is provided into the activation layer etchant bath. For instance, as one example, the activation layer deposition process may include providing the semiconductor wafer into an etchant bath for a first process period. The activation layer deposition process may include removing the semiconductor wafer from the etchant bath. After removing the semiconductor wafer from the etchant bath, the activation layer deposition process may include providing the semiconductor wafer in the etchant bath for a second process period. The process may be repeated any number of times without deviating from the scope of the present disclosure.

In some examples, the activation layer deposition process may include providing the semiconductor wafer into the activation layer etchant bath or other bath used during electroless deposition at different orientations of the semiconductor wafer. For instance, semiconductor wafers may have a notch or flat used to indicate the orientation of the crystal in the semiconductor wafer and/or the orientation of devices or semiconductor die on the semiconductor wafer relative to the crystal. In some embodiments, the activation layer deposition process may include adjusting the orientation of the semiconductor wafer such that the notch or flat is in various positions when provided into the activation layer etchant bath.

The orientation of the semiconductor wafer into the activation layer etchant bath may be determined based on many factors. In some examples, the orientation of the semiconductor wafer may be based on a size of the semiconductor wafer, a size of semiconductor die on the semiconductor wafer, a layout of contact pads (e.g., location of the gate pad) on the semiconductor die on the semiconductor wafer, the orientation of sides of the semiconductor die on the semiconductor wafer, the orientation of contact pads or other metal layers on the semiconductor die, and/or other factors. Methods according to example aspects of the present disclosure may include determining an orientation of the semiconductor wafer for providing into the activation layer etchant bath (or other baths), loading the semiconductor wafer into a wafer carrier based on the determined orientation, and providing the semiconductor wafer into the activation layer etchant bath based on the determined wafer orientation.

In some embodiments, the wafer orientation is determined to reduce a build up of nodules along an edge of an electroless deposited metal layer (e.g., edge of a contact pad) on the semiconductor wafer. For instance, the present inventors have discovered that the orientation of the semiconductor wafer when being provided into the activation layer etchant bath (or other bath) may result in the build up of nodules along an edge of a metal contact pad as the semiconductor wafer is removed from the activation layer etchant bath and the activation layer etchant solution flows down the surface of the semiconductor wafer (e.g., and contact pads on the semiconductor wafer). Aspects of the present disclosure are directed to adjusting an orientation of the semiconductor wafer prior to providing the semiconductor wafer into the activation layer etchant bath to reduce the formation of nodules along the edges and other regions of the metal contact pad.

For instance, in some embodiments, the semiconductor wafer may be oriented such that a direction of immersion of the semiconductor wafer into the activation layer etchant bath is generally parallel to a side of one or more semiconductor die on the semiconductor wafer. In some embodiments, the semiconductor wafer may be oriented such that a direction of immersion of the semiconductor wafer into the activation layer etchant bath is generally perpendicular to a side of one or more semiconductor die on the semiconductor wafer. In some embodiments, the semiconductor wafer may be oriented such that a direction of immersion of the semiconductor wafer into the activation layer etchant bath is not generally parallel or generally perpendicular (e.g., is angled) to a side of one or more semiconductor die on the semiconductor wafer.

In some embodiments, the semiconductor wafer may be oriented such that a direction of immersion of the semiconductor wafer into the activation layer etchant bath is generally parallel to an edge of a contact pad on the semiconductor wafer. In some embodiments, the semiconductor wafer may be oriented such that a direction of immersion of the semiconductor wafer into the activation layer etchant bath is generally perpendicular to an edge of a contact pad on the semiconductor wafer. In some embodiments, the semiconductor wafer may be oriented such that a direction of immersion of the semiconductor wafer into the activation layer etchant bath is not generally parallel or generally perpendicular (e.g., is angled) to an edge of a contact pad on the semiconductor wafer.

In some embodiments, the orientation of the semiconductor wafer is selected such that an average surface roughness Ra of the metal contact pad along the perimeter or edge of the metal contact pad is about 30 nm or less, such as in a range of about 20 nm to about 29 nm. For instance, the average surface roughness Ra of the metal contact pad in an edge region that extends about 25 nm from a perimeter of metal contact pad is about 30 nm or less, such as in a range of about 20 nm to about 29 nm.

For instance, in some embodiments, the activation layer deposition process may include providing the semiconductor wafer such that the orientation of the notch is in a range of about 15° to about 85° to the direction of immersion of the semiconductor wafer into the activation layer etchant bath, such as about 30° to about 60° to the direction of immersion of the semiconductor wafer into the activation layer etchant bath. In some embodiments, the semiconductor wafer may be provided at a first orientation into the etchant bath for a first process period and a second orientation that is different from the first orientation for a second process period.

After the activation layer deposition process is completed and an activation layer is formed on the semiconductor wafer, the electroless deposition process may include depositing one or more metal layers on the activation layer. In some examples, the metal may include, for instance, nickel, palladium, and/or gold.

In some examples, the electroless deposition process includes providing the semiconductor wafer into the activation layer deposition bath (e.g., zincate solution bath) three or more times. This may improve uniformity of the catalytic surface on which the metal layer is deposited using the electroless deposition process.

In some examples, the electroless deposition process may include adjusting a flow rate (e.g., increasing or decreasing) of a solution associated with one or more baths used during the electroless deposition process, such as an acid clean bath, activation layer deposition bath, etchant bath, and/or metal electroless deposition bath. Adjusting the flow rate of the solution may reduce the formation of nodules on the metal layers during the electroless deposition process.

In some examples, the electroless deposition process may not include an acid clean bath or other acid clean process or may reduce the process period associated with the acid clean bath or other acid clean process used to clean the surface (e.g., aluminum surface) before deposition of the activation layer.

In some embodiments, the uniformity of the activation layer may be increased by increasing or decreasing a process period associated with the activation layer deposition bath (e.g., zincate solution). In some embodiments, the uniformity of the activation layer may be increased by increasing or decreasing a process period associated with the activation layer etchant bath (e.g., etchant bath, such as a nitric acid bath). Increasing the uniformity of the activation layer will reduce the formation of nodules on the metal layer(s) deposited on the activation layer during the electroless deposition process.

In some embodiments, contaminants may be reduced by changing out the solutions associated with one or more baths used during the electroless deposition process, such as an acid clean bath, activation layer deposition bath, etchant bath, and/or metal electroless deposition bath with increased frequency.

In some embodiments, other techniques may be used to deposit the activation layer. For instance, in some examples, a sputter deposition process or physical vapor deposition process may be used to deposit the activation layer. This may increase the uniformity of the activation layer, leading to reduced nodule formation.

Aspects of the present disclosure provide a number of technical effects and benefits. For instance, the present inventors have discovered that performing a multi-dip activation layer deposition process results in a substantial reduction in nodule formation rate on the metal layers of a semiconductor wafer during semiconductor device fabrication on the semiconductor wafer. For instance, in some examples, implementing the multi-dip activation layer deposition process for multiple process periods achieves reduced nodule formation rate on the metal layers of a semiconductor device relative to just providing the semiconductor wafer in the etchant bath or other process bath for an extended process period.

In some embodiments, the electroless deposition process(s) according to examples of the present disclosure result in a semiconductor device having a metal contact pad (e.g., gate pad, source pad, and/or drain pad). The metal contact pad has at least one nodule reduced region over a span of at least about 50 microns, such as over a span of at least about 100 microns, such as at least 200 microns. A 50 micron nodule reduced region is defined as a continuous region having a radius of 50 microns where the surface roughness does not exceed 50 nm. A 100 micron nodule reduced region is defined as a continuous region having a radius of 100 microns where the surface roughness does not exceed 50 nm. A 200 micron nodule reduced region is defined as a continuous region having a radius of 200 microns where the surface roughness does not exceed 50 nm. In some examples, an average surface Ra across the entire metal contact pad is about 30 nm or less, such as in a range of about 20 nm to about 29 nm.

In some examples, the electroless deposition process(s) according to examples of the present disclosure result in an increase in nodule rejection yield on a semiconductor wafer. Nodule rejection yield provides a measure of the percentage of semiconductor devices on a semiconductor wafer that are not rejected or identified as not suitable for operation as a result of the presence of nodules on the semiconductor device. In some examples, the electroless deposition process produces a semiconductor wafer with a nodule rejection yield of at least about 65%, such as at least about 85%, such as at least about 95%. This may represent an increase in nodule reduction yield of at least about 25% relative to electroless deposition process(s) that do not include a multi-dip activation layer deposition process.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, structure, region, or substrate is referred to as being "on" or extending "onto" another element, it may be directly on or extend directly onto the other element or intervening elements may also be present and may be only partially on the other element. In contrast, when an element is referred to as being "directly on" or extending "directly onto" another element, there are no intervening elements present, and may be partially directly on the other element. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

As used herein, a first structure "at least partially overlaps" or is "overlapping" a second structure if an axis that is perpendicular to a major surface of the first structure passes through both the first structure and the second structure. A "peripheral portion" of a structure includes regions of a structure that are closer to a perimeter of a surface of the structure relative to a geometric center of the surface of the structure. A "center portion" of the structure includes regions of the structure that are closer to a geometric center of the surface of the structure relative to a perimeter of the surface. "Generally perpendicular" means within 15 degrees of perpendicular. "Generally parallel" means within 15 degrees of parallel.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

Aspects of the present disclosure are discussed with reference to silicon carbide-based transistor devices for purposes of illustration and discussion. Those of ordinary skill in the art, using the disclosures provided herein, will appreciate that certain aspects of the present disclosure may be applicable to other transistor devices without deviating from the scope of the present disclosure.

In the drawings and specification, there have been disclosed typical embodiments and, although specific terms are employed, they are used in a generic and descriptive sense only and not for purposes of limitation of the scope set forth in the following claims.

FIG. 1 is a schematic plan view of a semiconductor wafer 10 that includes a plurality of power semiconductor devices 100 according to example embodiments of the present disclosure. Referring to FIG. 1, the semiconductor wafer 10 may be a thin planar structure that includes a semiconductor structure with other material layers such as insulating layers and/or metal layers (e.g., electroless deposited metal layers) formed thereon. The semiconductor structure may include a semiconductor substrate and/or a plurality of other semiconductor layers (e.g., epitaxial layers). In some examples, the semiconductor wafer 10 includes a wide bandgap semiconductor, such as silicon carbide and/or a Group III-nitride.

A plurality of power semiconductor devices 100 may be formed in the semiconductor wafer 10. The semiconductor devices 100 may be formed in rows and columns and may be spaced apart from each other so that the semiconductor wafer 10 may later be singulated (e.g., diced) to separate the individual semiconductor devices 100 for packaging and testing. The semiconductor wafer 10, in some examples, may comprise a silicon carbide substrate having one or more silicon carbide layers formed thereon (e.g., by epitaxial growth). Other semiconductor layers (e.g., polysilicon layers), insulating layers and/or metal layers may be formed on the silicon carbide semiconductor layer structure to form the power semiconductor devices 100. The silicon carbide substrate and the silicon carbide layers formed thereon may be 4H silicon carbide in some embodiments.

Aspects of the present disclosure are discussed with reference to a silicon carbide-based semiconductor wafer 10 and power semiconductor devices 100 such as MOSFETs for purposes of illustration and discussion. Those of ordinary skill in the art, using the disclosures provided herein, will understand that semiconductor wafers based on other materials systems (e.g., silicon, Group III-nitride, sapphire, etc.) may be used without deviating from the scope of the present disclosure.

Figure 2:
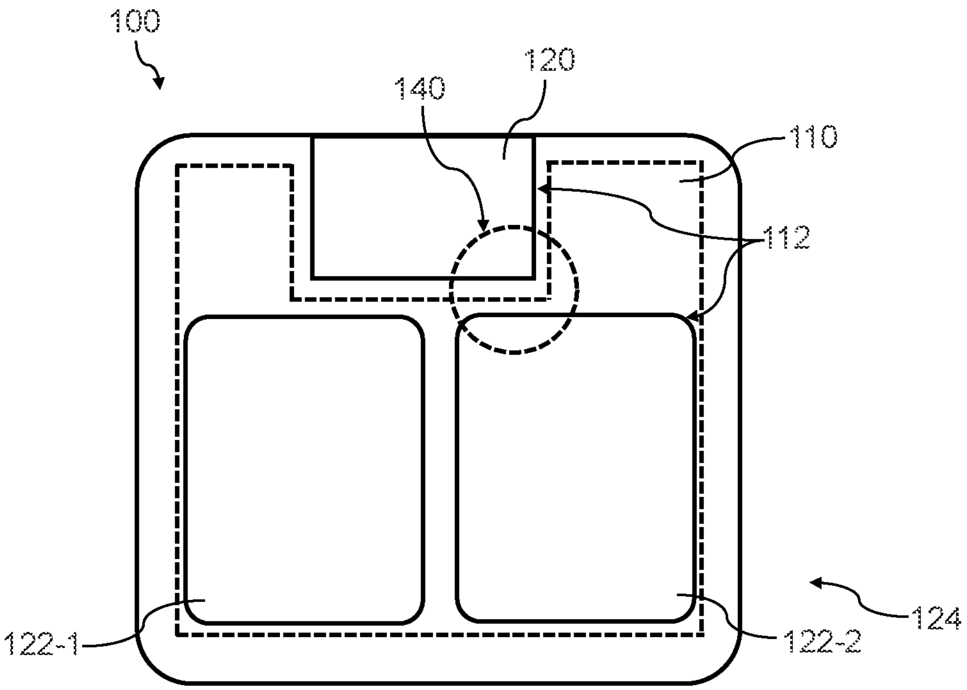
FIG. 2 depicts a plan view of one of the semiconductor devices included on the semiconductor wafer of FIG. 1.

FIG. 2 is a plan view of one of the power semiconductor devices 100 included on the semiconductor wafer 10 of FIG. 1. The power semiconductor device 100 may be an n-type power MOSFET. However, those of ordinary skill in the art, using the disclosures provided herein, will understand that aspects of the present disclosure may be implemented in a p-type power MOSFET or other semiconductor device (e.g., IGBT, Schottky diode, HEMT, etc.) without deviating from the scope of the present disclosure.

As shown in FIG. 2, a protective layer 110 covers a substantial portion of the top surface of the power semiconductor device 100. The protective layer 110 may be formed, for example, of polyamide. Various contact pads may be exposed through openings 112 in the protective layer 110. The contact pads may include a gate contact pad 120 and one or more source contact pads 122. Two source contact pads 122-1, 122-2 are illustrated in FIG. 2A. While not visible in FIG. 2, a drain contact pad 124 may be provided on the bottom side of the power semiconductor device 100. The contact pads 120, 122, 124 may be formed of a metal. The contact pads may be coupled to terminals in a semiconductor package to provide a gate terminal, source terminal, and drain terminal respectively for the semiconductor device. The contact pads 120, 122, and 124 may be electroless deposited defined contact pads that are formed using an electroless deposition process according to examples of the present disclosure.

Figure 3:
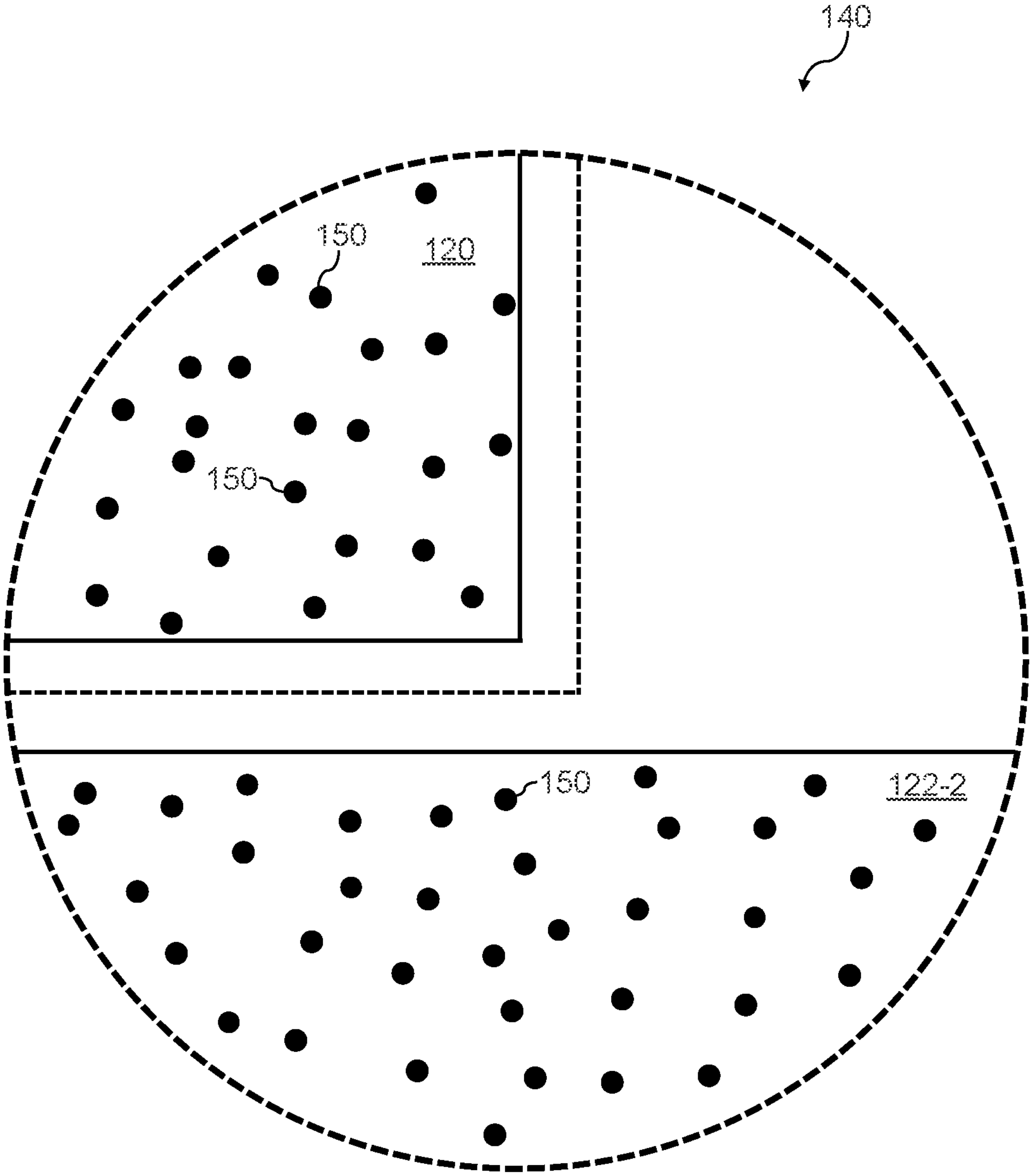
FIG. 3 depicts a close-up view of example nodules on a metal pad of a semiconductor device.

FIG. 3 depicts a close-up of region 140 on the semiconductor device 100. As shown, the region 140 includes a portion of the gate contact pad 120 and one of the source contact pad 122-2. At least a portion of the metal layers of the gate contact pad 120 and the source contact pad 122-2 are deposited using an electroless deposition process such that the gate contact pad 120 and the source contact pad 122-2 are electroless deposition defined contact pads. The electroless deposition process has resulted in nodules 150 on the surface of both the gate contact pad 120 and the source contact pad 122-2. The nodules 150 are localized areas of surface roughness that exceed 30 nm. The nodules 150 may result in inoperability or performance degradation of the semiconductor device 100. Examples of the present disclosure are directed to systems and methods for conducting electroless deposition processes that reduce the formation of nodules 150 on, for instance, the contact pads of the semiconductor device 100.

Figure 4:
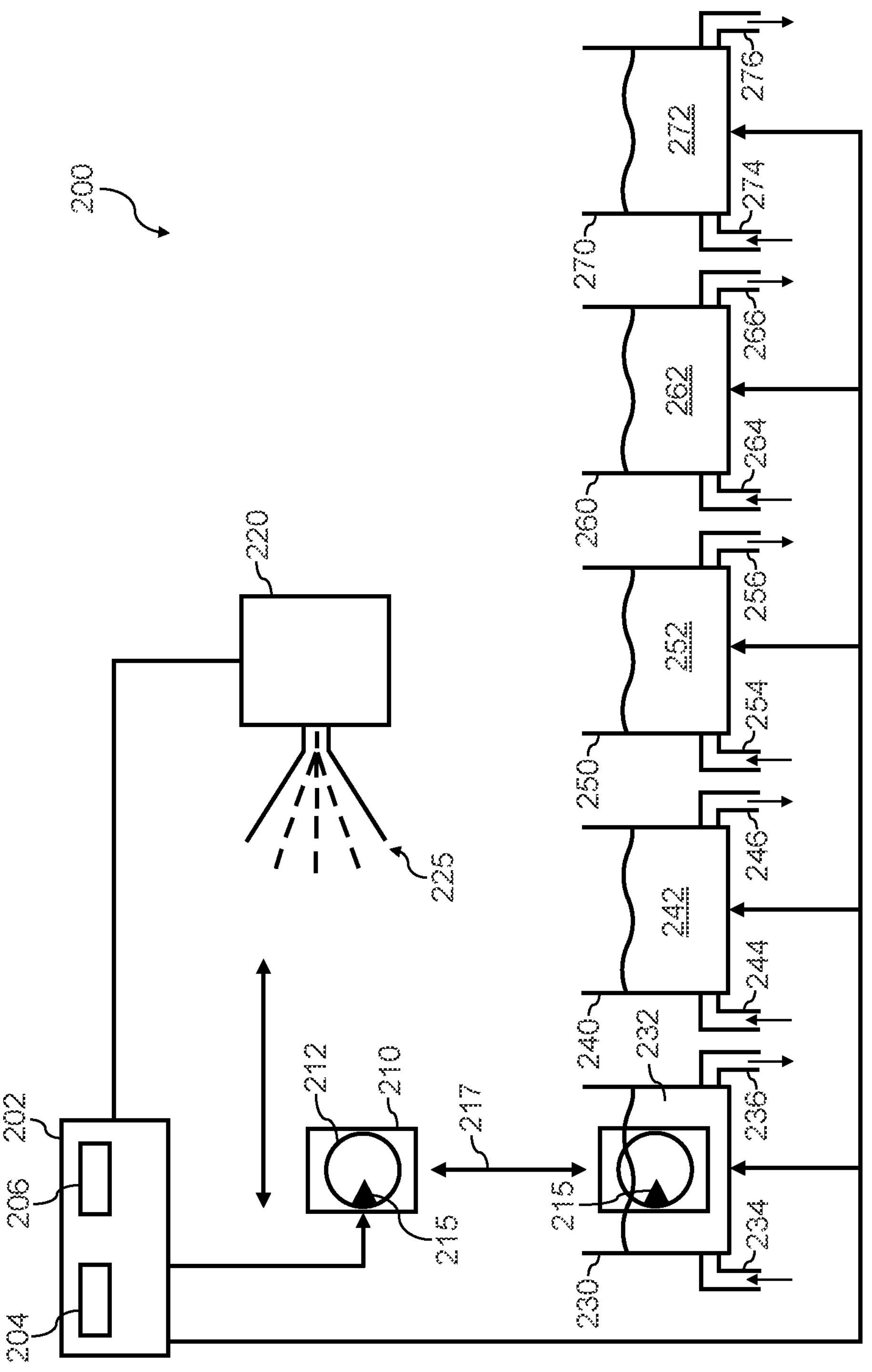
FIG. 4 depicts an example system for electroless deposition according to example embodiments of the present disclosure.

FIG. 4 depicts an example system 200 that may be used to implement aspects of the electroless deposition process for formation of, for instance, metal layers such as contact pads 120, 122, and 124 of a semiconductor device 100 according to example embodiments of the present disclosure. The system 200 includes one or more control devices, such as a controller 202. The controller 202 may include one or more processors 204 and one or more memory devices 206. The one or more memory devices 206 may store computer-readable instructions that when executed by the one or more processors 204 cause the one or more processors 204 to perform one or more control functions, such as any of the functions described herein. The controller 202 may be in communication with various other aspects of the system 200 through one or more wired and/or wireless control links. The controller 202 may send control signals to the various components of the system 200 to control the various components of the system 200 as described below.

The system 200 may include a semiconductor wafer carrier 210. The semiconductor wafer carrier 210 may be operable to hold and transport one or more semiconductor wafers 212 through the system 200. The controller 202 may be operable to control the semiconductor wafer carrier 210 to move the semiconductor wafer carrier 210 through the system 200 through various actuators.

The one or more semiconductor wafers 212 may have an orientation. For instance, the one or more semiconductor wafers 212 may have an orientation associated with a notch or a flat. The notch or flat may indicate the orientation of the crystal in the semiconductor wafer. In the example of FIG. 4, the semiconductor wafer 212 has a notch 215. In one example, a line drawn from the wafer center to the notch 215 may be generally parallel to a plane of the crystal structure of the semiconductor wafer 212.

The one or more semiconductor wafers 212 may be provided into one or more baths (e.g., an etchant bath) along a direction of immersion 217. The notch 215 may be oriented in different directions relative to the direction of immersion 217. The direction of orientation of the notch 215 is considered to be the direction from a center of the semiconductor wafer to the notch 215.

The system 200 may include a rinse system 220. The rinse system 220 may be configured to rinse the semiconductor wafer carrier 210 and one or more semiconductor wafers 212 before and/or after any of the process operations of an electroless deposition process. In some examples, the rinse system 220 may be operable to spray water 225 or other fluid onto the one or more semiconductor wafers 212 in the semiconductor wafer carrier 210 to conduct a rinse process. The controller 202 may be configured to control the rinse system 220 to implement a rinse process on the one or more semiconductor wafers.

The system 200 may include a plurality of baths. The baths may include, for instance, passivation clean bath 230, an acid clean bath 240, an activation layer deposition bath 250, an activation layer etchant bath 260 (e.g., etchant bath), and one or more electroless deposition baths 270. A single electroless deposition bath 270 is illustrated in FIG. 4. However, the system may include two or more electroless deposition baths 270 without deviating from the scope of the present disclosure.

As described herein, the term "bath" is used to describe a vessel with a solution. The semiconductor wafer may be provided into the bath, for instance, by immersion into the solution or otherwise exposing the semiconductor wafer to the solution (e.g., via a spray). The terms providing a semiconductor into a "bath" and providing a semiconductor wafer into a "solution" are used interchangeably throughout.

The passivation clean bath 230 may include a vessel operable to hold a passivation clean solution 232. The passivation clean solution 232 can be, for instance, dilute hydrochloric acid, sulfuric acid, hydrofluoric acid, or sodium bisulfate. The controller 202 can be configured to control the semiconductor wafer carrier 210 to provide one or more semiconductor wafers 212 into the passivation clean bath 230 for processing in the passivation clean solution 232. The controller 202 may be operable to control a flow rate of the passivation clean solution 232 in the passivation clean bath 230, for instance, by controlling the flow of the passivation clean solution 232 through inlet 234 and outlet 236. The controller 202 may be operable to control the semiconductor wafer carrier 210 to provide (e.g., immerse) the one or more semiconductor wafers 212 into the passivation clean bath 230 for a passivation clean process period. The passivation clean process period may be the length of time the semiconductor wafer 212 may be provided into the passivation clean solution 232 of the passivation clean bath 230.

The acid clean bath 240 may include a vessel operable to hold an acid clean solution 242. The acid clean solution 242 can be, for instance, hydrochloric acid, hydrofluoric acid, ammonium hydroxide, or phosphoric acid. The controller 202 can be configured to control the semiconductor wafer carrier 210 to provide one or more semiconductor wafers 212 into the passivation clean bath 240 for processing in the acid clean solution 242. The controller 202 may be operable to control a flow rate of the acid clean solution 242 in the acid clean bath 240, for instance, by controlling the flow of the acid clean solution 242 through inlet 244 and outlet 246. The controller 202 may be operable to control the semiconductor wafer carrier 210 to provide (e.g., immerse) the one or more semiconductor wafers 212 into the acid clean bath 240 for an acid clean process period. The acid clean process period may be the length of time the semiconductor wafer 212 may be provided into the acid clean solution 242 of the acid clean bath 240.

The activation layer deposition bath 250 may include a vessel operable to hold an activation layer deposition solution 252. The activation layer deposition solution 252 can be, for instance, a zincate solution, a nickel solution, or a copper solution. The controller 202 can be configured to control the semiconductor wafer carrier 210 to provide one or more semiconductor wafers 212 into the activation layer deposition bath 250 for processing in the activation layer deposition solution 252. The controller 202 may be operable to control a flow rate of the activation layer deposition solution 252, for instance, by controlling the flow of the activation layer deposition solution 252 through inlet 254 and outlet 256. The controller 202 may be operable to control the semiconductor wafer carrier 210 to provide (e.g., immerse) the one or more semiconductor wafers 212 into the activation layer deposition bath 250 for an activation layer deposition process period. The process period may be the length of time the semiconductor wafer 212 may be provided into the activation layer deposition solution 252 of the activation layer deposition bath 250.

The activation layer etchant bath 260 (also referred to herein as an etchant bath) may include a vessel operable to hold an activation layer etchant solution 262. The activation layer etchant solution 262 can be, for instance, an etchant solution, such as nitric acid, hydrochloric acid, sulfuric acid, hydrofluoric acid, or phosphoric acid. In some embodiments, the activation layer etchant solution 262 may have a concentration of nitric acid ($HNO_3$) in a range of about 5% to about 45% by volume in solution (e.g., water), such as a concentration in range of about 10% to about 35%, such as in a range of 15% to about 25%. The controller 202 can be configured to control the semiconductor wafer carrier 210 to provide one or more semiconductor wafers 212 into the activation layer etchant bath 260 for processing in the activation layer etchant solution 262. The controller 202 may be operable to control a flow rate of the activation layer etchant solution 262, for instance, by controlling the flow of the activation layer etchant solution 262 through inlet 264 and outlet 266. The controller 202 may be operable to control the semiconductor wafer carrier 210 to provide (e.g., immerse) the one or more semiconductor wafers 212 into the activation layer etchant bath 260 for a process period. The process period may be the length of time the semiconductor wafer 212 may be provided into the activation layer etchant solution 262 of the activation layer etchant bath 260.

According to examples of the present disclosure, the controller 202 may be operable to control the semiconductor wafer carrier 210 to implement a multi-dip process. For instance, the controller 202 may control the semiconductor wafer carrier 210 to provide the one or more semiconductor wafers 212 into the activation layer etchant bath 260 for a first process period. The first process period may be, for instance, in a range of about 2 seconds to about 120 seconds, such as about 5 seconds to about 60 seconds, such as about 5 seconds to about 30 seconds, such as about 10 seconds to about 20 seconds. After the first process period the controller 202 may provide the one or more semiconductor wafers 212 to the rinse system. After rinsing the one or more semiconductor wafers 212, the controller 202 may control the semiconductor wafer carrier 210 to provide the one or more semiconductor wafers 212 into the activation layer etchant bath for a second process period. The second process period may be, for instance, in a range of about 2 seconds to about 120 seconds, such as about 5 seconds to about 60 seconds, such as about 5 seconds to about 30 seconds, such as about 10 seconds to about 20 seconds. The process can repeated more times without deviating from the scope of the present disclosure.

In some examples, the system 200 may be operable to provide the one or more semiconductor wafers 212 into the different baths, including the activation layer etchant bath 260, at different orientations. The orientation of the one or more semiconductor wafers 212 for providing the semiconductor wafer 212 into any of the different baths of the system 100 may be selected to reduce nodule formation on the semiconductor wafer, for instance, as discussed with reference to FIGS. 9-12.

The one or more electroless deposition baths 270 may include a vessel operable to hold an electroless deposition solution 272. The electroless deposition solution 272 can include metal ions used, for instance, to deposit one or more metals using electroless deposition, such as nickel, palladium, gold, etc. The controller 202 can be configured to control the semiconductor wafer carrier 210 to provide one or more semiconductor wafers 212 into one or more electroless deposition baths 270 to deposit one or more metal layers. The controller 202 may be operable to control a flow rate of the electroless deposition solution 272, for instance, by controlling the flow of the electroless deposition solution 272 through inlet 274 and outlet 276. The controller 202 may be operable to control the semiconductor wafer carrier 210 to provide (e.g., immerse) the one or more semiconductor wafers 212 into the one or more electroless deposition baths 270 for a process period. The process period may be the length of time the semiconductor wafer 212 may be provided into the electroless deposition solution 272 of the one or more electroless deposition bath 270.

Figure 5:
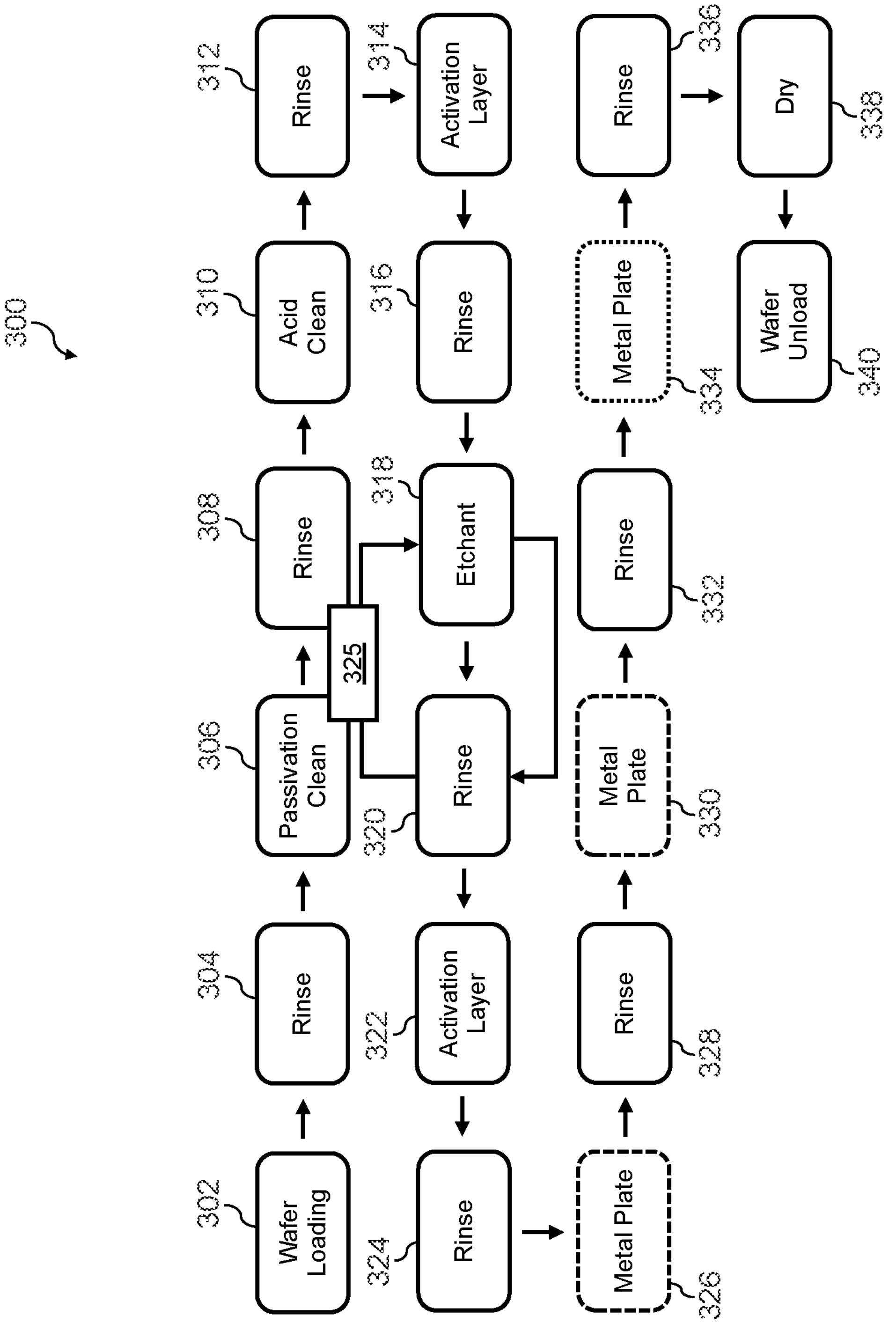
FIG. 5 depicts an example method for electroless deposition according to example embodiments of the present disclosure.

FIG. 5 depicts a flow diagram of an example method 300 for electroless deposition according to example embodiments of the present disclosure. The method 300 may be implemented, for instance, using the example system 200 of FIG. 4. However, other suitable electroless deposition systems may be used without deviating from the scope of the present disclosure. FIG. 5 depicts certain operations performed in a particular order for purposes of illustration and discussion. Those of ordinary skill in the art, using the disclosures provided herein, will understand that the various operations of any of the methods provided herein may be adapted, rearranged, include steps not illustrated, repeated, omitted, and/or otherwise modified in various ways without deviating from the scope of the present disclosure.

At 302, the method may include loading a semiconductor wafer into, for instance, a semiconductor wafer carrier. For instance, a semiconductor wafer 212 may be loaded into the semiconductor wafer carrier 210. In some examples, the semiconductor wafer may include a plurality of semiconductor devices. In some examples, the semiconductor wafer may include a wide bandgap semiconductor, such as silicon carbide and/or a Group III-nitride. However, the semiconductor wafer may be based on other materials systems, such as silicon, sapphire, etc. The semiconductor devices on the semiconductor wafer may be, for instance, silicon carbide-based MOSFETs, silicon carbide-based Schottky diodes, Group III-nitride based HEMTs, or other suitable semiconductor devices.

At 304, the method includes conducting a rinse process on the semiconductor wafer. The rinse process may include, for instance, rinsing the semiconductor wafer with water or other fluid. For instance, in some examples, the semiconductor wafer carrier 210 may transport one or more semiconductor wafers 212 to the rinse system 220. The rinse system 220 may spray water 225 or otherwise rinse the one or more semiconductor wafers 212.

At 306, the method includes performing a passivation clean process on the semiconductor wafer. For instance, the semiconductor wafer carrier 210 may provide (e.g., immerse) the one or more semiconductor wafers 212 into the passivation clean solution 232 of the passivation clean bath 230. The passivation clean bath may both passivate a metal layer on the semiconductor wafer (e.g., aluminum layer) as well as remove any miscellaneous particles or debris from the surface of the metal layer. In some examples, the method may include adjusting (e.g., increasing or decreasing) a flow rate of the passivation clean solution in the passivation clean bath. In some examples, the method may include adjusting (e.g., increasing or decreasing) a passivation clean process period during which the semiconductor wafer is provided in the passivation clean bath.

At 308, the method includes conducting a rinse process on the semiconductor wafer. The rinse process may include, for instance, rinsing the semiconductor wafer with water or other fluid. In some examples, the semiconductor wafer carrier 210 may transport one or more semiconductor wafers 212 to the rinse system 220. The rinse system 220 may spray water 225 or otherwise rinse the one or more semiconductor wafers 212.

At 310, the method 300 includes performing an acid clean process on the semiconductor wafer. For instance, the semiconductor wafer carrier 210 may provide (e.g., immerse) the one or more semiconductor wafers 212 into the acid clean solution 242 of the acid clean bath 240. The acid clean process may at least partially etch a surface of the metal layer (e.g., aluminum layer) on the semiconductor wafer to ready the surface for deposition of the activation layer. In some examples, the acid clean process may be omitted. In some examples, the method may include adjusting (e.g., increasing or decreasing) a flow rate of the acid clean solution in the acid clean bath. In some examples, the method may include adjusting (e.g., increasing or decreasing) an acid clean process period during which the semiconductor wafer is provided in the acid clean bath.

At 312, the method 300 includes conducting a rinse process on the semiconductor wafer. The rinse process may include, for instance, rinsing the semiconductor wafer with water or other fluid. In some examples, the semiconductor wafer carrier 210 may transport one or more semiconductor wafers 212 to the rinse system 220. The rinse system 220 may spray water 225 or otherwise rinse the one or more semiconductor wafers 212.

At 314, the method 300 includes performing a first activation layer deposition process to deposit an activation layer on the semiconductor wafer. The activation layer may be, for instance, a zinc layer. In some examples, the semiconductor wafer carrier 210 may provide (e.g., immerse) the one or more semiconductor wafers 212 into the activation layer deposition solution 252 (e.g., zincate solution) of the activation layer deposition bath 250. In some examples, the method may include adjusting (e.g., increasing or decreasing) a flow rate of the activation layer solution in the activation layer deposition bath. In some examples, the method may include adjusting (e.g., increasing or decreasing) a process period during which the semiconductor wafer is provided in the activation layer deposition bath.

Other suitable methods may be used to deposit the activation layer without deviating from the scope of the present disclosure. For instance, in some examples, the activation layer may be deposited using a sputter deposition process or physical vapor deposition process.

Referring back to FIG. 5 at 316, the method 300 includes conducting a rinse process on the semiconductor wafer. The rinse process may include, for instance, rinsing the semiconductor wafer with water or other fluid. In some examples, the semiconductor wafer carrier 210 may transport one or more semiconductor wafers 212 to the rinse system 220. The rinse system 220 may spray water 225 or otherwise rinse the one or more semiconductor wafers 212.

At 318, the method 300 includes performing an activation layer etchant process to etch or remove at least a portion of an activation layer on the semiconductor wafer. For instance, the semiconductor wafer carrier 210 may provide (e.g., immerse) the one or more semiconductor wafers 212 into the activation layer etchant solution 262 of the activation layer etchant bath 260 (e.g., etchant bath). The activation layer etchant process 318 may remove at least a portion of the activation layer deposited at 314. In some examples, the method may include adjusting (e.g., increasing or decreasing) a flow rate of the activation layer etchant solution in the activation layer etchant bath. In some examples, the method may include adjusting an orientation of the semiconductor wafer prior to providing the one or more semiconductor wafers into the activation layer etchant bath. For instance, the one or more semiconductor wafers may have a notch. The one or more semiconductor wafers may be oriented such that the notch is to the direction of immersion of the semiconductor wafer into the activation layer etchant bath.

The activation layer etchant process may be performed for a first process period. The first process period may be, for instance, in a range of about 2 seconds to about 120 seconds, such as about 5 seconds to about 60 seconds, such as about 5 seconds to about 30 seconds, such as about 10 seconds to about 20 seconds. In some examples, the method may include adjusting (e.g., increasing or decreasing) a process period during which the semiconductor wafer is provided in the activation layer etchant bath. The method may include removing the semiconductor wafer from the activation layer etchant bath (e.g., etchant bath) after the first process period.

At 320, the method 300 includes conducting a rinse process on the semiconductor wafer. The rinse process may include, for instance, rinsing the semiconductor wafer with water or other fluid. In some examples, the semiconductor wafer carrier 210 may transport one or more semiconductor wafers 212 to the rinse system 220. The rinse system 220 may spray water 225 or otherwise rinse the one or more semiconductor wafers 212.

As indicated by 325, after conducting the rinse process, the method may return to 318 to perform a second activation layer etchant process (e.g., an etchant process) to etch or remove at least a portion of an activation layer on the semiconductor wafer. For instance, the semiconductor wafer carrier 210 may provide (e.g., re-immerse) the one or more semiconductor wafers 212 into the activation layer etchant solution 262 (e.g., nitric acid) of the activation layer etchant bath 260 (e.g., etchant bath). The activation layer etchant process 325 may remove at least a portion of the activation layer deposited at 314. In some examples, the method may include adjusting (e.g., increasing or decreasing) a flow rate of the activation layer etchant solution in the activation layer etchant bath.

The second activation layer etchant process may be performed for a second process period. The second process period may be, for instance, in a range of about 2 seconds to about 120 seconds, such as about 5 seconds to about 60 seconds, such as about 5 seconds to about 30 seconds, such as about 10 seconds to about 20 seconds. In some examples, the method may include adjusting (e.g., increasing or decreasing) the second process period during which the semiconductor wafer is provided in the activation layer etchant bath. The method may include removing the semiconductor wafer from the activation layer etchant bath (e.g., etchant bath) after the second process period.

The method 300 may repeat 318 and 320 two or more times to provide a multi-dip activation layer deposition process. For instance, the method 300 may repeat 318 and 320 three or more times, such as four or more times, such as five or more times, such as six or more times. As described above, the multi-dip activation layer deposition process may reduce nodule formation on metal layers.

At 322, the method 300 includes performing a second activation layer deposition process to deposit the activation layer on the semiconductor wafer. For instance, the semiconductor wafer carrier 210 may provide (e.g., immerse) the one or more semiconductor wafers 212 into the activation layer deposition solution 252 (e.g., zincate solution) of the activation layer deposition bath 250. In some examples, the method may include adjusting (e.g., increasing or decreasing) a flow rate of the activation layer solution in the activation layer deposition bath. In some examples, the method may include adjusting (e.g., increasing or decreasing) a process period during which the semiconductor wafer is provided in the activation layer deposition bath.

Other suitable methods may be used to deposit the activation layer without deviating from the scope of the present disclosure. For instance, in some examples, the activation layer may be deposited using a sputter deposition process or physical vapor deposition process.

In some examples, the method 300 may repeat 314, 316, 318, and 320 two or more times to provide a multi-dip activation layer deposition process. For instance, the method 300 may repeat 314, 316, 318, and 320 three or more times, such as four or more times, such as five or more times, such as six or more times. As described above, the multi-dip activation layer deposition process may reduce nodule formation on metal layers.

At 324, the method 300 includes conducting a rinse process on the semiconductor wafer. The rinse process may include, for instance, rinsing the semiconductor wafer with water or other fluid. In some examples, the semiconductor wafer carrier 210 may transport one or more semiconductor wafers 212 to the rinse system 220. The rinse system 220 may spray water 225 or otherwise rinse the one or more semiconductor wafers 212.

At 326, the method includes performing an electroless deposition process to form a metal layer (e.g., a nickel layer) on the activation layer that is formed at 322. For instance, the semiconductor wafer carrier 210 may provide (e.g., immerse) the one or more semiconductor wafers 212 into the electroless deposition solution 272 of the electroless deposition bath 270. The electroless deposition process may electroless deposit a metal layer (e.g., a nickel layer) on the activation layer. In some examples, the method may include adjusting (e.g., increasing or decreasing) a flow rate of the activation layer solution in the electroless deposition bath. In some examples, the method may include adjusting (e.g., increasing or decreasing) a process period during which the semiconductor wafer is provided in the electroless deposition bath. In some examples, as illustrated in FIG. 5, the electroless deposition of metal layers may be carried out in multiple process operations.

At 328, the method 300 includes conducting a rinse process on the semiconductor wafer. The rinse process may include, for instance, rinsing the semiconductor wafer with water or other fluid. In some examples, the semiconductor wafer carrier 210 may transport one or more semiconductor wafers 212 to the rinse system 220. The rinse system 220 may spray water 225 or otherwise rinse the one or more semiconductor wafers 212.

At 330, the method includes performing an electroless deposition process to form a metal layer (e.g., a palladium layer) on the activation layer that is formed at 322. For instance, the semiconductor wafer carrier 210 may provide (e.g., immerse) the one or more semiconductor wafers 212 into the electroless deposition solution 272 of the electroless deposition bath 270. The electroless deposition process may electroless deposit a metal layer (e.g., a palladium layer) on the semiconductor wafer. In some examples, the method may include adjusting (e.g., increasing or decreasing) a flow rate of the electroless deposition solution in the electroless deposition bath. In some examples, the method may include adjusting (e.g., increasing or decreasing) a process period during which the semiconductor wafer is provided in the electroless deposition bath.

At 332, the method 300 includes conducting a rinse process on the semiconductor wafer. The rinse process may include, for instance, rinsing the semiconductor wafer with water or other fluid. In some examples, the semiconductor wafer carrier 210 may transport one or more semiconductor wafers 212 to the rinse system 220. The rinse system 220 may spray water 225 or otherwise rinse the one or more semiconductor wafers 212.

At 334, the method includes performing an electroless deposition process to form a metal layer (e.g., a gold layer) on the activation layer that is formed at 322. For instance, the semiconductor wafer carrier 210 may provide (e.g., immerse) the one or more semiconductor wafers 212 into the electroless deposition solution 272 of the electroless deposition bath 270. The electroless deposition process may electroless deposit a metal layer (e.g., a gold layer) on the semiconductor wafer. In some examples, the method may include adjusting (e.g., increasing or decreasing) a flow rate of the electroless deposition solution in the electroless deposition bath. In some examples, the method may include adjusting (e.g., increasing or decreasing) a process period during which the semiconductor wafer is provided in the electroless deposition bath.

At 336, the method 300 includes conducting a rinse process on the semiconductor wafer. The rinse process may include, for instance, rinsing the semiconductor wafer with water or other fluid. In some examples, the semiconductor wafer carrier 210 may transport one or more semiconductor wafers 212 to the rinse system 220. The rinse system 220 may spray water 225 or otherwise rinse the one or more semiconductor wafers 212.

At 338, the method 300 includes drying the semiconductor wafer. For instance, the semiconductor wafer may be subjected to a drying process. The drying process may be facilitated with one or more fans, heaters, or other components.

At 340, the method 300 includes unloading the semiconductor wafer. For instance, the one or more semiconductor wafers 212 may be removed from the semiconductor wafer carrier 210.

Figure 6:
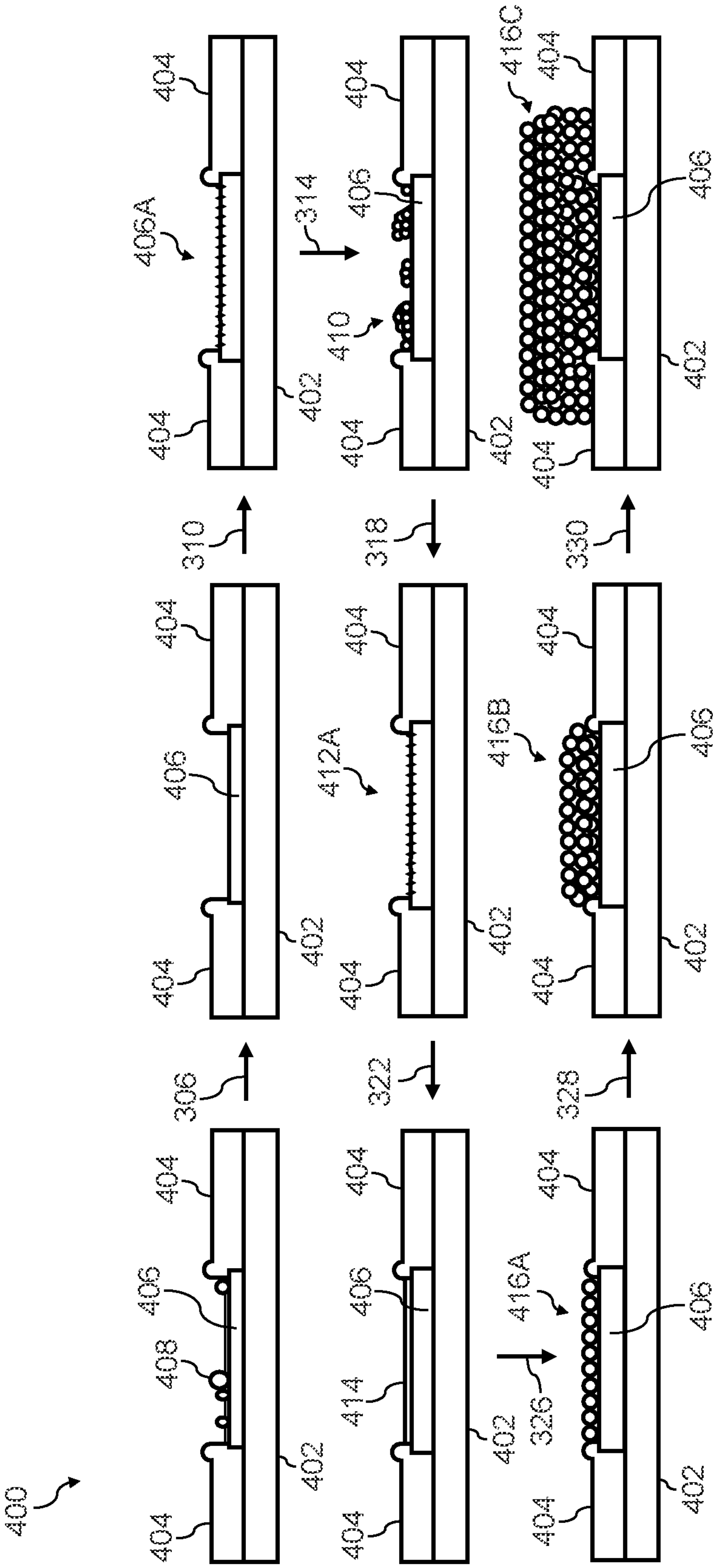
FIG. 6 depicts cross-sectional views of an example semiconductor wafer during an electroless deposition process according to example embodiments of the present disclosure.

FIG. 6 depicts a cross-sectional view of a semiconductor wafer 400 as it undergoes various of the process operations described with reference to FIG. 5. As shown, the semiconductor wafer 400 includes a semiconductor structure 402 (e.g., substrate with one or more semiconductor layers) and a dielectric layer 404 on the semiconductor structure 402. The dielectric layer 404 may be silicon dioxide or other suitable dielectric layer. A metal layer 406 is exposed through the dielectric layer 404. The metal layer 406 may be a portion of a conductive contact pad for a semiconductor device (e.g., gate pad, drain pad, source pad). The metal layer 406 may be aluminum or other suitable metal.

As shown in FIG. 6, prior to undergoing the passivation clean process of 306 of FIG. 5, the semiconductor wafer 400 includes particles 408 or debris on the metal layer 406. The passivation clean process at 306 of FIG. 5 may remove the particles and debris from the metal layer 406. The acid clean process at 310 of FIG. 5 may roughen the metal layer 406. The roughened surface 406A of the metal layer 406 promotes adhesion of an activation layer to the surface of the metal layer 406 during subsequent activation layer deposition processes.

The activation layer deposition process 314 of FIG. 5 may deposit a non-uniform activation layer 410 on the metal layer 406. The non-uniform activation layer 410 may lead to the formation of nodules. The multi-dip activation layer etchant process 318 (repeated two or more times as indicated by 325 in FIG. 5) removes a portion of the activation layer 410 but leaves a roughened surface 412A to promote further uniform adhesion of the activation layer in later activation layer deposition processes. For instance, the activation layer deposition process 322 of FIG. 5 may deposit a more uniform activation layer 414 on the metal layer 406. The more uniform activation layer 414 leads to reduced nodule formation.

FIG. 6 depicts the formation of metal layers 416A, 416B, and 416C on the activation layer 414 after conducting the electroless deposition process(s) 326, 328 and 330 of FIG. 5. As shown, a metal plated layer may be formed on the metal layer 406 using electroless deposition. The metal plated layer may be a portion of a contact pad for a semiconductor device according to example embodiments of the present disclosure.

Figure 7:
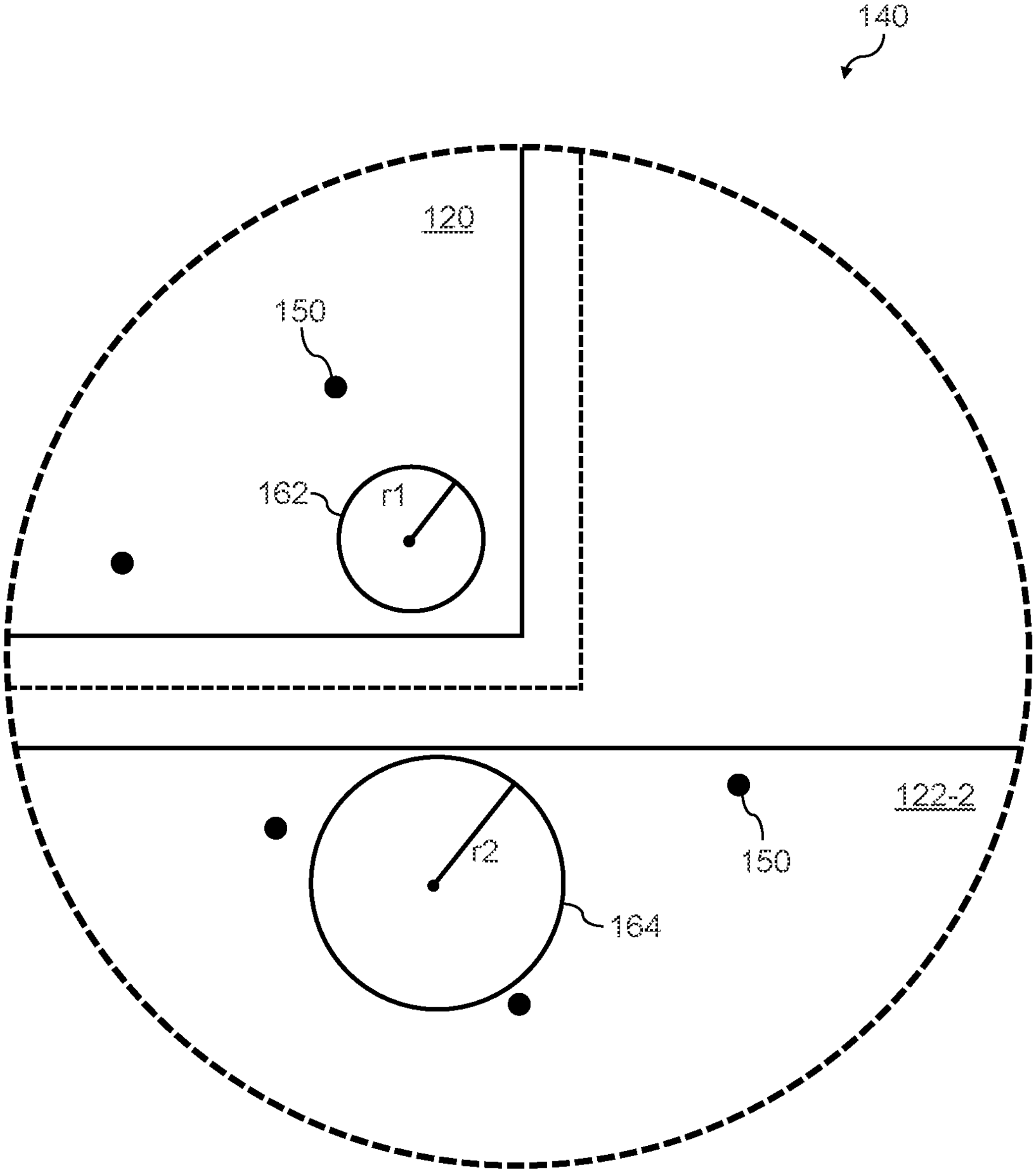
FIG. 7 depicts a close-up view of example nodules on a metal pad of a semiconductor device according to example embodiments of the present disclosure.

FIG. 7 depicts a close-up view of a region 140 of a semiconductor device on a semiconductor wafer that has been subjected to an electroless deposition process according to example embodiments of the present disclosure. As illustrated, the number of nodules 150 on the gate contact pad 120 and the source contact pad 122-2 have been reduced compared to the illustration of FIG. 3.

In some examples, as shown in FIG. 7, the semiconductor wafer may include a 50 micron nodule reduced region 162. The 50 micron nodule reduced region is a region on the gate pad 120 having a radius r1 of about 50 microns that does not include any nodules having a surface roughness greater than 50 nm.

In some examples, as shown in FIG. 7, the semiconductor wafer may include a 100 micron nodule reduced region 164. The 100 micron nodule reduced region is a region on the source pad 122-2 having a radius r2 of about 100 microns that does not include any nodules having a surface roughness greater than 50 nm.

In some examples, an average surface roughness across the gate contact pad 120 is in a range of about 30 nm or less, such as in a range of about 20 nm to about 29 nm. In some examples, an average surface roughness across the source contact pad 122-2 is in a range of about 30 nm or less, such as in a range of about 20 nm to about 29 nm.

Figure 8A:
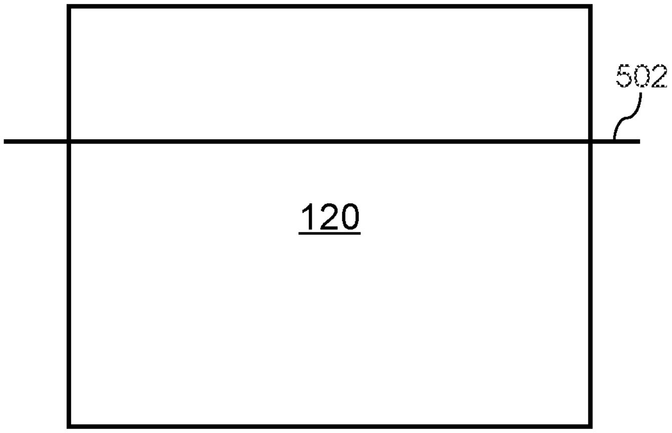
FIGS. 8A, 8B, and 8C depict example roughness data for a metal pad of a semiconductor device according to example embodiments of the present disclosure.
Figure 8B:
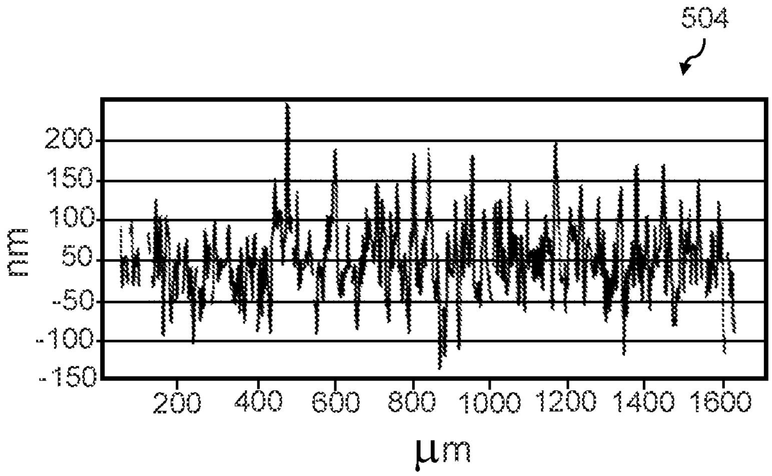
Figure 8C:
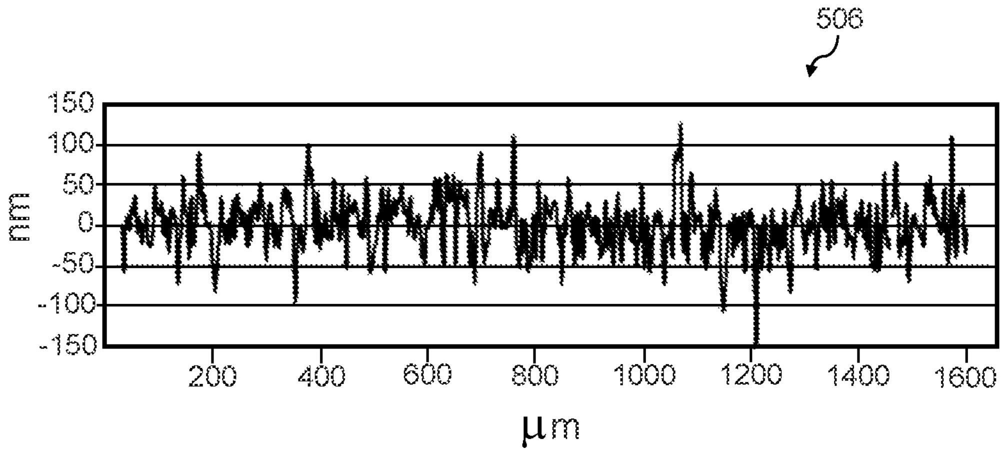

FIGS. 8A, 8B, and 8C depict example roughness measurements for a gate contact pad 120. More particularly, FIGS. 8B and 8C depict a plot of roughness measurements across slice 502 on an example gate contact pad 120. FIG. 8B depicts roughness measurements for a gate contact pad

120 after undergoing an electroless deposition process that does not include a multi-dip activation layer deposition process. In FIG. 8B, the gate contact pad was subjected to a single process period in an activation layer etchant bath. FIG. 8B depicts a plot 504 of surface roughness along the vertical axis as a function of distance along the slice 502 on the horizontal axis. An average roughness across the slice 502 is greater than about 30 nm.

FIG. 8C depicts roughness measurements for a gate contact pad 120 after undergoing an electroless deposition process that does include a multi-dip activation layer deposition process according to example embodiments of the present disclosure. In FIG. 8C, the gate contact pad was subjected to two separate process periods in an activation layer etchant bath. FIG. 8C depicts a plot 506 of surface roughness along the vertical axis as a function of distance along the slice 502 on the horizontal axis. An average roughness across the slice 502 is less than about 30 nm.

With reference to FIGS. 9-12, example embodiments directed to adjusting orientation of a semiconductor wafer when providing the semiconductor wafer into an activation layer etchant bath (or other bath) will be discussed in detail. The orientation of the semiconductor wafer into the activation layer etchant bath (or other bath) may be determined based on many factors. In some examples, the orientation of the semiconductor wafer relative to a direction of immersion into an activation layer etchant bath (or other bath) may be based on a size of the semiconductor wafer, a size of semiconductor die on the semiconductor wafer, a layout of contact pads (e.g., location of the gate pad) on the semiconductor die on the semiconductor wafer, the orientation of sides of the semiconductor die on the semiconductor wafer, the orientation of contact pads or other metal layers on the semiconductor die, the orientation of the edges of the contact pads or other metal layers on the semiconductor die, and other factors. Methods according to example aspects of the present disclosure may include determining an orientation of the semiconductor wafer for providing into the activation layer etchant bath (or other bath), loading the semiconductor wafer into a wafer carrier based on the determined orientation, and providing the semiconductor wafer into the activation layer etchant bath based on the determined wafer orientation.

Figure 9:
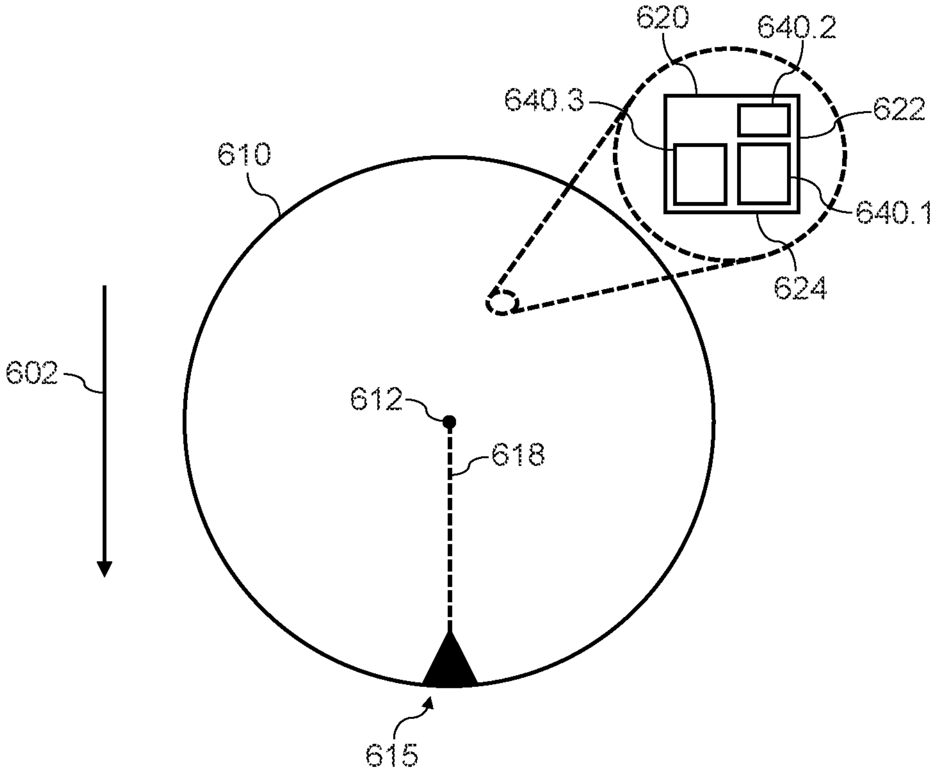
FIG. 9 depicts example orientation of a semiconductor wafer during providing the semiconductor wafer to an activation layer etchant bath according to example embodiments of the present disclosure.

FIG. 9 depicts example orientation of a semiconductor wafer 610 relative a direction of immersion 602 into an activation layer etchant bath (or other bath) according to example embodiments of the present disclosure. The semiconductor wafer 610 includes a plurality of semiconductor die 620 associated with a semiconductor device, such as a silicon carbide-based MOSFET or Schottky diode. One semiconductor die 620 is depicted in FIG. 9 for purposes of illustration and discussion. The semiconductor die 620 include a first side 622 and a second side 624. The semiconductor die 620 further includes a plurality of electroless deposited contact pads 640.1, 640.2, 640.3, 640.4, . . . 640.*n*. Each of the contact pads 640.1, 640.2, 640.3, 640.4, . . . 640.*n* has a plurality of edges. Four contact pads 640.1, 640.2, 640.3, 640.4 are illustrated in FIG. 9 for purposes of illustration and discussion. Those of ordinary skill in the art, using the disclosures provided herein, will understand that the semiconductor die 620 can include more or fewer contact pads without deviating from the scope of the present disclosure.

The semiconductor wafer 610 of FIG. 9 has a notch 615. The notch 615 is oriented such a line 618 from a center 612 of the semiconductor wafer 610 to the notch 615 may be generally parallel to a plane of the crystal structure of the semiconductor wafer 610. In addition, the semiconductor die 620 is oriented on the semiconductor wafer 610 such that the side 622 of the semiconductor die 620 is generally parallel to the line 618 and the side 624 is generally perpendicular to the line 618. The contact pads 640.1, 640.2, 640.3, 640.4, . . . 640.*n* include at least one edge that is generally parallel to the line 618.

In the example of FIG. 9, the semiconductor wafer 610 may be provided into an activation layer etchant bath along a direction of immersion 602. In the example of FIG. 9, the semiconductor wafer 610 is oriented such that the line 618 is generally parallel to the direction of immersion 602 into the activation layer etchant bath. In addition, the semiconductor wafer 610 is oriented such that the side 622 of the semiconductor die is generally parallel to the direction of immersion 602. In addition, the semiconductor wafer 610 is oriented such that an edge of each of the contact pads 640.1, 640.2, 640.3, 640.4, . . . 640.*n* is generally parallel to the direction of immersion 602.

Figure 10:
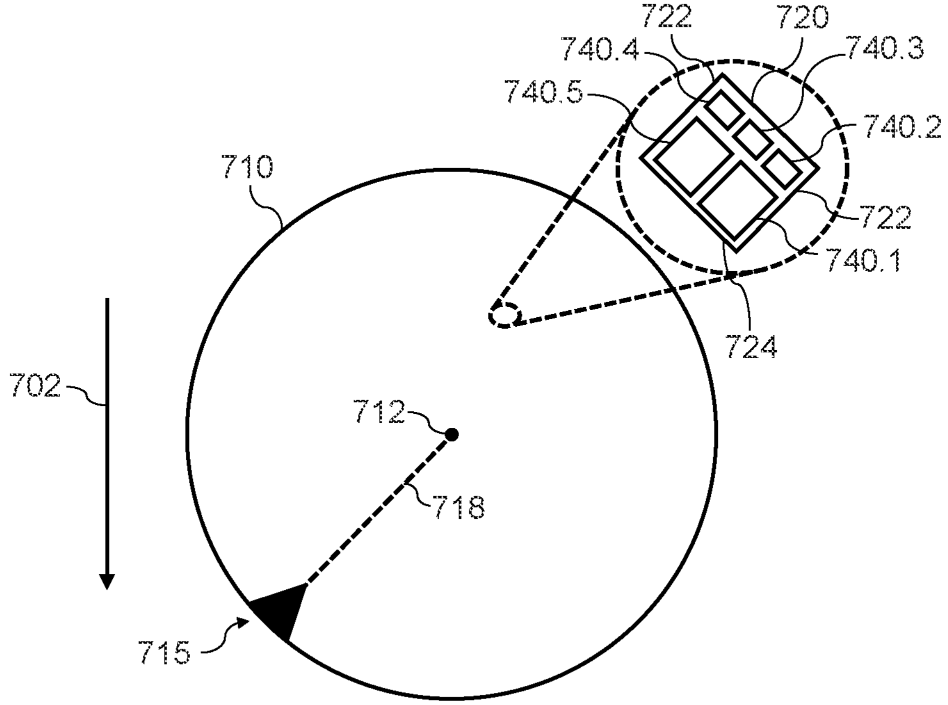
FIG. 10 depicts example orientation of a semiconductor wafer during providing the semiconductor wafer to an activation layer etchant bath according to example embodiments of the present disclosure.

FIG. 10 depicts example orientation of a different semiconductor wafer 710 relative a direction of immersion 702 into an activation layer etchant bath (or other bath) according to example embodiments of the present disclosure. The semiconductor wafer 710 includes a plurality of semiconductor die 720 associated with a semiconductor device, such as a silicon carbide-based MOSFET or Schottky diode. One semiconductor die 720 is depicted in FIG. 10 for purposes of illustration and discussion. The semiconductor die 720 include a first side 722 and a second side 724. The semiconductor die 720 further includes a plurality of electroless deposited contact pads 740.1, 740.2, 740.3, 740.4, 740.5, . . . 740.*n*. Five contact pads 740.1, 740.2, 740.3, 740.4, 740.5 are illustrated in FIG. 10 for purposes of illustration and discussion. Those of ordinary skill in the art, using the disclosures provided herein, will understand that the semiconductor die 720 can include more or fewer contact pads without deviating from the scope of the present disclosure.

The semiconductor wafer 710 of FIG. 10 has a notch 715. The notch 715 is oriented such a line 718 from a center 712 of the semiconductor wafer 710 to the notch 715 may be generally parallel to a [1$\bar{1}$00] plane of the crystal structure of the semiconductor wafer 710. In addition, the semiconductor die 720 is oriented on the semiconductor wafer 710 such that the side 722 of the semiconductor die 720 is generally parallel to the line 718 and the side 724 is generally perpendicular to the line 718. The contact pads 740.1, 740.2, 740.3, 740.4, 740.5, . . . 740.*n* include at least one edge that is generally parallel to the line 718.

In the example of FIG. 10, the semiconductor wafer 710 may be provided into an activation layer etchant bath along a direction of immersion 702. In the example of FIG. 10, the semiconductor wafer 710 is oriented such that the line 718 is angled relative to the direction of immersion 702 into the activation layer etchant bath. In addition, the semiconductor wafer 710 is oriented such that the side 722 of the semiconductor die is angled to the direction of immersion 702. In addition, the semiconductor wafer 610 is oriented such that an edge of each of the contact pads 740.1, 740.2, 740.3, 740.4, 740.5, . . . 740.*n* is angled relative to the direction of immersion.

In some embodiments, the semiconductor wafer 710 is provided in the activation layer etchant bath such that an orientation of the notch 715 is in a range of about 15° to about 75° to a direction of immersion 702 of the semiconductor wafer 710 into the activation layer etchant bath, such as in a range of about 30° to about 60°. For instance, the semiconductor wafer 710 is provided in the activation layer etchant bath such that an edge of a contact pad on the semiconductor wafer 710 is in a range of about 15° to about 75° to a direction of immersion 702 of the semiconductor wafer 710 into the activation layer etchant bath, such as in a range of about 30° to about 60°.

Figure 11:
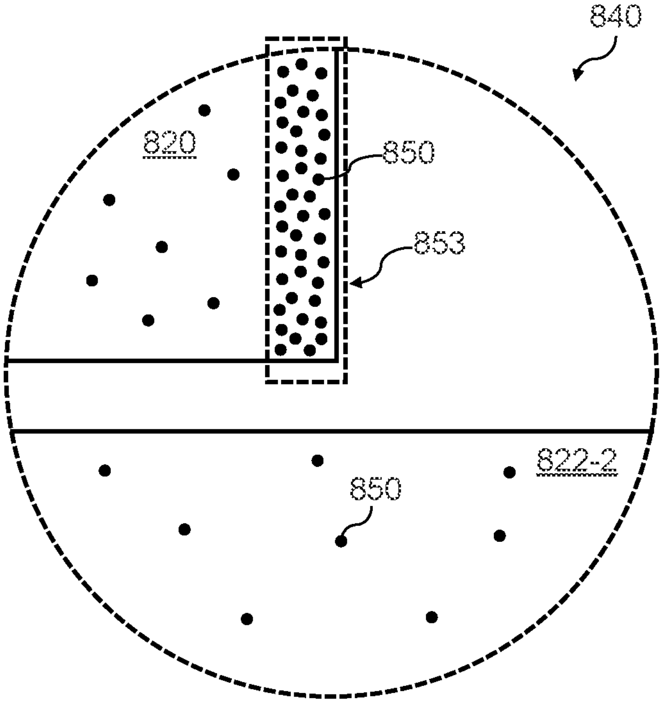
FIG. 11 depicts a close-up view of example nodules on a metal pad of a semiconductor device.

FIG. 11 depicts a close-up of a region 840 on a semiconductor device/die on an example semiconductor wafer. As shown, the region 840 includes a portion of the gate contact pad 820 and a source contact pad 822-2. At least a portion of the metal layers of the gate contact pad 820 and the source contact pad 822-2 are deposited using an electroless deposition process such that the gate contact pad 820 and the source contact pad 822-2 are electroless deposition defined contact pads. The electroless deposition process has resulted in nodules 850 on the surface of both the gate contact pad 820 and the source contact pad 822-2. As a result of the orientation of the semiconductor wafer into an activation layer etchant bath during the electroless deposition process, the gate contact pad 820 may include a build up of excess nodules 850 in an edge region 853 along an edge of the gate contact pad 820.

Figure 12:
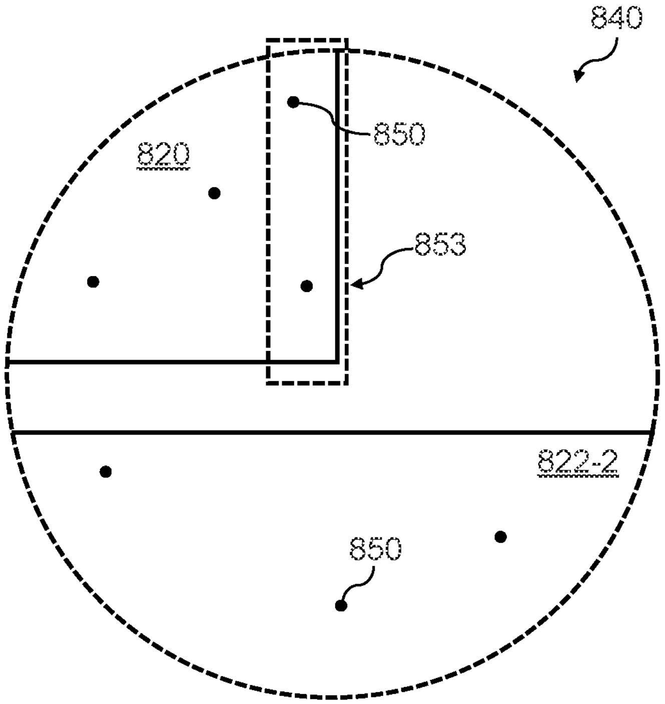
FIG. 12 depicts a close-up view of example nodules on a metal pad of a semiconductor device according to example embodiments of the present disclosure.

FIG. 12 depicts a close-up of the region 840 on the semiconductor wafer when the semiconductor wafer is oriented during providing the semiconductor wafer to an activation layer etchant bath to reduce nodule formation according to example embodiments of the present disclosure. As shown in FIG. 12 and as a result of the orientation of the semiconductor wafer (e.g., the direction of immersion is angled relative to a side of the semiconductor die or side of the gate contact pad 820), the number of nodules 850 in the edge region 853 along an edge of the gate contact pad 820 is reduced. In some embodiments, the orientation of the semiconductor wafer is selected such that an average surface roughness Ra of the metal contact pad along the perimeter or edge of the metal contact pad is about 30 nm or less, such as in a range of about 20 nm to about 29 nm.

Example aspects of the present disclosure are set forth below. Any of the below features or examples may be used in combination with any of the embodiments or features provided in the present disclosure.

One example aspect of the present disclosure is directed to a method for electroless deposition of a metal layer on a wide bandgap semiconductor device. The method includes providing a semiconductor wafer having one or more wide bandgap semiconductor devices. The method includes performing an activation layer deposition process on at least a portion of the semiconductor wafer to deposit an activation layer. At least a portion of the activation layer deposition process comprises an activation layer etchant process. The method includes depositing one or more metal layers on the activation layer using an electroless deposition process. Conducting the activation layer etchant process includes providing the semiconductor wafer in an etchant bath for a first process period; removing the semiconductor wafer from the etchant bath; and after removing the semiconductor wafer from the etchant bath, providing the semiconductor wafer in the etchant bath for a second process period.

In some examples, the activation layer comprises zinc.

In some examples, the activation layer deposition process comprises providing the semiconductor wafer in a zincate solution bath.

In some examples, the method comprises performing a second activation layer deposition process after performing the activation layer etchant process.

In some examples, the method comprises: performing a second activation layer etchant process after the second activation layer deposition process; and performing a third activation layer deposition process after the second activation layer etchant process.

In some examples, the activation layer etchant process further comprises performing a rinse process on the semiconductor wafer after removing the semiconductor wafer from the etchant bath and prior to providing the semiconductor wafer in the etchant bath for the second process period.

In some examples, the activation layer etchant process further comprises: after providing the semiconductor wafer in the etchant bath for the second process period, removing the semiconductor wafer from the etchant bath; and after removing the semiconductor wafer from the etchant bath, providing the semiconductor wafer in the etchant bath for a third process period.

In some examples, the etchant bath comprises nitric acid.

In some examples, the method comprises adjusting a flow rate of the etchant bath to reduce a nodule formation rate on the semiconductor wafer.

In some examples, depositing one or more metal layers on the activation layer using an electroless deposition process comprises one or more of: depositing a nickel layer on the activation layer; depositing a palladium layer on the nickel layer; or depositing a gold layer on the palladium layer.

In some examples, the electroless deposition process comprises providing the semiconductor wafer in one or more electroless deposition baths.

In some examples, the method comprises performing an acid clean process on the semiconductor wafer prior to performing the activation layer deposition process In some examples, the acid clean process is performed for an acid clean process period.

In some examples, the method comprises adjusting the acid clean process period to reduce a nodule formation rate on the semiconductor wafer.

In some examples, the activation layer deposition process comprises a sputter deposition process.

In some examples, the first process period and the second process period provide a nodule rejection yield for the semiconductor wafer of at least about 85%.

Another example aspect of the present disclosure is directed to a method of reducing nodule formation on one or more semiconductor devices on a semiconductor wafer. The method includes performing a multi-dip activation layer deposition process to form an activation layer for one or more contacts for semiconductor devices on the semiconductor wafer. The method includes electroless depositing one or more metal layers on the activation layer. The multi-dip activation layer deposition process provides a nodule rejection yield for the semiconductor wafer of at least about 65%.

In some examples, the multi-dip activation layer deposition process comprises: providing the semiconductor wafer in an activation layer deposition bath a plurality of times.

In some examples, the multi-dip activation layer deposition process comprises adjusting a flow rate of the activation layer deposition bath.

In some examples, the multi-dip activation layer deposition process comprises adjusting a process period where the semiconductor wafer is provided into the activation layer deposition bath.

In some examples, the multi-dip activation layer deposition process comprises: providing the semiconductor wafer in an activation layer etchant bath a plurality of times.

In some examples, the multi-dip activation layer deposition process comprises adjusting a flow rate of an activation layer etchant bath.

In some examples, the multi-dip activation layer deposition process comprises adjusting a process period where the semiconductor wafer is provided into the activation layer etchant bath.

In some examples, the multi-dip activation layer deposition process comprises rinsing the semiconductor wafer between providing the semiconductor wafer in an activation layer etchant bath.

In some examples, the method comprises performing an acid clean process on the semiconductor wafer prior to performing the multi-dip activation layer deposition process.

In some examples, the multi-dip activation layer deposition process comprises sputtering the activation layer on the semiconductor wafer.

Another example aspect of the present disclosure is directed to a method for electroless deposition of a metal layer on a semiconductor device on a semiconductor wafer. The method includes depositing a first activation layer on the semiconductor wafer. The method includes providing the semiconductor wafer in an etchant bath for a first process period. The method includes performing a rinse process on the semiconductor wafer. The method includes providing the semiconductor wafer in the etchant bath for a second process period. The method includes depositing a second activation layer on the semiconductor wafer.

In some examples, the first activation layer and the second activation layer comprise zinc.

In some examples, the etchant bath comprises nitric acid.

In some examples, the method further comprises depositing one or more metal layers on the activation layer using electroless deposition.

In some examples, the one or more metal layers comprise nickel.

In some examples, the one or more metal layers comprise palladium.

Another example aspect of the present disclosure is directed to a system for electroless deposition. The system includes an activation layer deposition bath. The system includes an activation layer etchant bath. The system includes a rinse system. The system includes a semiconductor wafer carrier operable to carry one or more semiconductor wafers. The system includes one or more control devices. The one or more control device are configured to control the semiconductor wafer carrier to perform operations. The operations includes provide the semiconductor wafer carrier into the activation layer deposition bath; providing the semiconductor wafer carrier into the activation layer etchant bath for a first process period; providing the semiconductor wafer carrier to the rinse system; and providing the semiconductor wafer carrier into the activation layer etchant bath for a second process period.

In some examples, the system further comprises one or more electroless deposition baths.

In some examples, the one or more control devices are configured to provide the semiconductor wafer carrier into the one or more electroless deposition baths.

In some examples, the one or more control devices are configured to provide the semiconductor wafer carrier into the activation layer deposition bath after providing the semiconductor wafer carrier into the activation layer etchant bath for the second process period.

In some examples, the one or more control devices are configured to adjust a flow rate associated with the activation layer deposition bath.

In some examples, the one or more control devices are configured to adjust a flow rate associated with the activation layer etchant bath.

In some examples, the one or more control devices are configured to adjust a flow rate associated with the one or more electroless deposition baths.

In some examples, the system further comprises an acid clean bath.

In some examples, the one or more control devices are configured to provide the semiconductor wafer carrier into the acid clean bath prior to providing the semiconductor wafer carrier into the activation layer deposition bath.

In some examples, the one or more control devices are configured to adjust an acid clean process period for providing the semiconductor wafer carrier into the acid clean bath.

In some examples, the one or more control devices are configured to adjust a flow rate associated with the acid clean bath.

Another example aspect of the present disclosure is directed to a semiconductor wafer. The semiconductor wafer includes at least one semiconductor device. The at least one semiconductor device has an electroless deposited metal layer. The electroless deposited metal layer includes at least one 50 micron nodule reduced region.

In some examples, the electroless deposited metal layer comprises at least one 100 micron nodule reduced region.

In some examples, the electroless deposited metal layer comprises a contact pad for the at least one semiconductor device.

In some examples, the contact pad has an average surface roughness in a range of 20 nm to about 29 nm.

In some examples, the semiconductor wafer has a nodule rejection yield of at least about 85%.

In some examples, the semiconductor wafer has a nodule rejection yield of at least about 95%.

In some examples, the semiconductor wafer comprises silicon carbide.

In some examples, the at least one semiconductor device comprises a silicon carbide-based MOSFET, a silicon carbide-based Schottky diode, or a Group III-nitride based HEMT.

Another example aspect of the present disclosure is directed to a semiconductor wafer. The semiconductor wafer includes at least one semiconductor device. The at least one semiconductor device has an electroless deposited metal layer. The semiconductor wafer has a nodule rejection yield of at least about 65%.

In some examples, the semiconductor wafer has a nodule rejection yield of at least about 85%.

In some examples, the semiconductor wafer has a nodule rejection yield of at least about 95%.

In some examples, the semiconductor wafer comprises silicon carbide.

In some examples, the at least one semiconductor device comprises a silicon carbide-based MOSFET, a silicon carbide-based Schottky diode, or a Group III-nitride based HEMT.

Another example embodiment of the present disclosure is directed to a method for electroless deposition of a contact pad on a semiconductor wafer. The method includes providing the semiconductor wafer in an activation layer etchant bath along a direction of immersion. The method includes electroless depositing a contact pad for a semiconductor device on the semiconductor wafer. The semiconductor wafer is oriented relative to the direction of immersion such that an average surface roughness along an edge region of the contact pad is in a range of about 20 nm to about 29 nm. The edge region is defined as a region within 25 nm from the perimeter of the contact pad.

In some examples, the semiconductor wafer is oriented such that a side of the contact pad is generally parallel to the direction of immersion.

In some examples, the semiconductor wafer is oriented such that the edge of the contact pad is angled relative to the direction of immersion.

In some examples, the semiconductor wafer is oriented such that the edge of the contact pad is in a range of about 15° to about 75° to the direction of immersion.

In some examples, the semiconductor wafer is oriented such that the edge of the contact pad is in a range of about 30° to about 60° to the direction of immersion.

In some examples, the semiconductor wafer comprises silicon carbide.

In some examples, the contact pad is associated with a silicon carbide-based MOSFET, a silicon carbide-based Schottky diode, or a Group III-nitride based HEMT.

Another example embodiment of the present disclosure is directed to a semiconductor wafer. The semiconductor wafer includes at least one semiconductor device. The at least one semiconductor device has an electroless deposited metal layer. The electroless deposited metal layer comprises an edge region having an average surface roughness in a range of about 20 nm to about 29 nm. The edge region is defined as a region within 25 nm from a perimeter of the metal layer.

In some examples, the electroless deposited metal layer comprises a contact pad for the at least one semiconductor device.

In some examples, the semiconductor wafer has a nodule rejection yield of at least about 85%.

In some examples, the semiconductor wafer has a nodule rejection yield of at least about 95%.

In some examples, the semiconductor wafer comprises silicon carbide.

In some examples, the at least one semiconductor device comprises a silicon carbide-based MOSFET, a silicon carbide-based Schottky diode, or a Group III-nitride based HEMT.

Another example aspect of the present disclosure is directed to a method for electroless deposition of a contact pad on a semiconductor wafer. The method includes providing the semiconductor wafer in an activation layer etchant bath along a direction of immersion. The method includes electroless depositing a contact pad for a semiconductor device on the semiconductor wafer. The semiconductor wafer is oriented relative to the direction of immersion such that a notch in the semiconductor wafer is angled relative to the direction of immersion.

In some examples, at least one contact pad on the semiconductor wafer has an edge that is angled relative to the direction of immersion.

In some examples, the contact pad is a gate pad.

In some examples, the semiconductor wafer comprises silicon carbide.

In some examples, the semiconductor wafer comprises a silicon carbide-based MOSFET, a silicon carbide-based Schottky diode, or a Group III-nitride based HEMT.

Another example embodiment of the present disclosure is directed to a method for electroless deposition of a contact pad on a semiconductor wafer. The method includes providing the semiconductor wafer in an activation layer etchant bath along a direction of immersion. The method includes electroless depositing a contact pad for a semiconductor device on the semiconductor wafer. The semiconductor wafer is oriented relative to the direction of immersion such that at least one contact pad on the semiconductor wafer has an edge that is generally parallel to the direction of immersion.

In some examples, the contact pad is a gate pad.

In some examples, the semiconductor wafer comprises silicon carbide.

In some examples, the semiconductor wafer comprises a silicon carbide-based MOSFET, a silicon carbide-based Schottky diode, or a Group III-nitride based HEMT.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for electroless deposition of a contact pad on a semiconductor wafer, comprising:

providing the semiconductor wafer in an activation layer etchant bath along a direction of immersion; and electroless depositing a contact pad for a semiconductor device on the semiconductor wafer; and wherein the semiconductor wafer is oriented relative to the direction of immersion such that an average surface roughness along an edge region of the contact pad is in a range of about 20 nm to about 29 nm, the edge region defined as a region within 25 nm from a perimeter of the contact pad.

2. The method of claim 1, wherein the semiconductor wafer is oriented such that a side of the contact pad is generally parallel to the direction of immersion.

3. The method of claim 1, wherein the semiconductor wafer is oriented such that the edge of the contact pad is angled relative to the direction of immersion.

4. The method of claim 1, wherein the semiconductor wafer is oriented such that the edge of the contact pad is in a range of about 15° to about 75° to the direction of immersion.

5. The method of claim 1, wherein the semiconductor wafer is oriented such the edge of the contact pad is in a range of about 30° to about 60° to the direction of immersion.

6. The method of claim 1, wherein the semiconductor wafer comprises silicon carbide.

7. The method of claim 1, wherein the contact pad is associated for a silicon carbide-based MOSFET, a silicon carbide-based Schottky diode, or a Group III-nitride based HEMT.

8. A semiconductor wafer, the semiconductor wafer comprising at least one semiconductor device, the at least one semiconductor device having an electroless deposited metal layer, wherein the electroless deposited metal layer comprises an edge region having an average surface roughness in a range of about 20 nm to about 29 nm, the edge region defined as a region within 25 nm from a perimeter of the metal layer.

9. The semiconductor wafer of claim 8, wherein the electroless deposited metal layer comprises a contact pad for the at least one semiconductor device.

10. The semiconductor wafer of claim 8, wherein the semiconductor wafer has a nodule rejection yield of at least about 85%.

11. The semiconductor wafer of claim 8, wherein the semiconductor wafer has a nodule rejection yield of at least about 95%.

12. The semiconductor wafer of claim 8, wherein the semiconductor wafer comprises silicon carbide.

13. The semiconductor wafer of claim 8, wherein the at least one semiconductor device comprises a silicon carbide-based MOSFET, a silicon carbide-based Schottky diode, or a Group III-nitride based HEMT.

14. A method for electroless deposition of a contact pad on a semiconductor wafer, comprising:

providing the semiconductor wafer in an activation layer etchant bath along a direction of immersion; and electroless depositing a contact pad for a semiconductor device on the semiconductor wafer; and wherein the semiconductor wafer is oriented relative to the direction of immersion such that a notch in the semiconductor wafer is angled relative to the direction of immersion.

15. The method of claim 14, wherein at least one contact pad on the semiconductor wafer has an edge that is angled relative to the direction of immersion.

16. The method of claim 15, wherein the contact pad is a gate pad.

17. The method of claim 14, wherein the semiconductor wafer comprises silicon carbide.

18. The method of claim 14, wherein the semiconductor wafer comprises a silicon carbide-based MOSFET, a silicon carbide-based Schottky diode, or a Group III-nitride based HEMT.

* * * * *